(12) United States Patent
Scherer et al.

(10) Patent No.: US 9,401,240 B2
(45) Date of Patent: Jul. 26, 2016

(54) INTEGRATED PASSIVE IRON SHIMS IN SILICON

(75) Inventors: Axel Scherer, Woodstock, VT (US); Michael David Henry, Altadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 465 days.

(21) Appl. No.: 13/037,365

(22) Filed: Mar. 1, 2011

(65) Prior Publication Data

US 2011/0210811 A1 Sep. 1, 2011

Related U.S. Application Data

(60) Provisional application No. 61/309,300, filed on Mar. 1, 2010.

(51) Int. Cl.
| | |
|---|---|
| *H01L 21/3065* | (2006.01) |
| *H01F 7/02* | (2006.01) |
| *G01R 33/3873* | (2006.01) |
| *H01F 41/04* | (2006.01) |
| *G01R 33/30* | (2006.01) |
| *G01R 33/38* | (2006.01) |
| *G01R 33/383* | (2006.01) |
| *H01L 21/311* | (2006.01) |

(52) U.S. Cl.
CPC .......... *H01F 7/0278* (2013.01); *G01R 33/3873* (2013.01); *H01F 41/042* (2013.01); *G01R 33/302* (2013.01); *G01R 33/383* (2013.01); *G01R 33/3806* (2013.01); *H01L 21/3065* (2013.01); *H01L 21/30655* (2013.01); *H01L 21/31116* (2013.01); *Y10T 29/4902* (2015.01)

(58) Field of Classification Search
CPC ............................................... H01H 2017/0066
USPC ............................................................ 335/78
See application file for complete search history.

(56) References Cited

U.S. PATENT DOCUMENTS

| | | | | |
|---|---|---|---|---|
| 5,557,132 | A * | 9/1996 | Takahashi | 257/415 |
| 6,404,313 | B2 * | 6/2002 | Asada | 335/222 |
| 6,633,158 | B1 * | 10/2003 | Shen et al. | 324/207.26 |
| 6,794,965 | B2 * | 9/2004 | Shen et al. | 335/78 |
| 6,900,925 | B2 * | 5/2005 | Kato et al. | 359/298 |
| 7,023,304 | B2 * | 4/2006 | Shen et al. | 335/78 |
| 7,038,834 | B2 * | 5/2006 | Kato et al. | 359/298 |
| 7,095,549 | B2 * | 8/2006 | Iwasaki et al. | 359/298 |
| 7,148,591 | B2 * | 12/2006 | Mizoguchi et al. | 310/36 |
| 7,250,838 | B2 * | 7/2007 | Shen et al. | 335/78 |
| 7,616,365 | B2 * | 11/2009 | Ko et al. | 359/224.1 |
| 2003/0053186 | A1 * | 3/2003 | Arima | 359/224 |
| 2005/0104694 | A1 * | 5/2005 | Cho et al. | 335/78 |

\* cited by examiner

*Primary Examiner* — Alexander Talpalatski
(74) *Attorney, Agent, or Firm* — Steinfl & Bruno, LLP

(57) ABSTRACT

A magnetic apparatus having at least one magnetic shim situated between faces of two permanent magnets. The magnetic shim helps to make the magnetic field that is accessible between the two permanent magnets a more uniform field. The magnetic shim is constructed on a thinned semiconductor wafer, such as silicon, by photolithographically defining locations on the wafer where magnetic material, such as iron or iron-nickel materials, are deposited. The shim can additional have photolihographically defined coil regions, in which conductive material such as copper can be deposited. Current contacts are provided to allow currents to be passed through the coil regions. Protective layers can be deposited to protect the deposited metals from mechanical or environmental damage.

11 Claims, 28 Drawing Sheets

$\gamma = 2.675222 \times 10^8$; $Bs = 6.66585647 \times 10^{-28}$; $hbar = \dfrac{6.626 \times 10^{-34}}{2 \times \pi}$; $spin = 1/2$; $Bo = 1.15$;

$\mu = 4 \times \pi \times 10^{-7}$; $a = gamma \times Bo$; $\delta = 70 \times 10^{-6}$; $P = 1.72 \times 10^{-8}$; $K = 1.3806503 \times 10^{-23}$; $T = 300$; $w = 40 \times 10^{-6}$; $h = 15 \times 10^{-6}$; $sd = 9.4 \times 10^{-6}$; $bw = 10000$;

$Mo = \dfrac{Bs \times gamma^2 \times hbar^2 \times spin \times (spin+1) \times Bo}{3 \times K \times T}$ $Radius = 250 \times 10^{-6}$; $turns = 1$;

$Bz[R\_, \rho\_, z\_, N\_] := \sum_{n=0}^{N-1}\left(\mu \times \dfrac{\rho}{\sqrt{((R+\delta \times n)+\rho)^2 + (z)^2}} \times \left[EllipticK\left[\dfrac{4 \times (R+\delta \times n) \times \rho}{((R+\delta \times n)+\rho)^2 + (z)^2}\right] + \dfrac{((R+\delta \times n)^2 - z^2 - (\rho)^2)}{((R+\delta \times n)-\rho)^2 + (z)^2} \times EllipticE\left[\dfrac{4 \times (R+\delta \times n) \times \rho}{((R+\delta \times n)+\rho)^2 + (z)^2}\right]\right]\right)$ $Noise[R\_, N\_] := \sqrt{4 \times K \times T \times bw \times \sum_{n=0}^{N-1}\left(P \times \dfrac{2 \times \pi \times (R+\delta \times n)}{(2 \times sd) \times (h)}\right)}$ $Resistance[R\_, N\_] := \sum_{n=0}^{N-1}\left(P \times \dfrac{2 \times \pi \times (R+\delta \times n)}{(2 \times sd) \times (h)}\right)$ $SNR = \dfrac{w \times Mo \times NIntegrate[Bz[Radius, height, radius, turns], \{height, 5 \times 10^{-6}, 24 \times 10^{-6}\}, \{radius, 0, Radius - 20 \times 10^{-6}\}]}{Noise[Radius, turns]}$ Signal = $w \times Mo \times NIntegrate[Bz[Radius, height, radius, turns], \{height, 5 \times 10^{-6}, 24 \times 10^{-6}\}, \{radius, 0, Radius - 20 \times 10^{-6}\}]$
NIntegrate[Bz[Radius, height, radius, turns], \{height, 5 \times 10^{-6}, 24 \times 10^{-6}\}, \{radius, 0, Radius - 20 \times 10^{-6}\}]
Resistance[Radius, turns]

Clear[turns]; turns = 2;
$SNR = \dfrac{w \times Mo \times NIntegrate[Bz[Radius, height, radius, turns], \{height, 5 \times 10^{-6}, 24 \times 10^{-6}\}, \{radius, 0, Radius - 20 \times 10^{-6}\}]}{Noise[Radius, turns]}$ Signal = $w \times Mo \times NIntegrate[Bz[Radius, height, radius, turns], \{height, 5 \times 10^{-6}, 24 \times 10^{-6}\}, \{radius, 0, Radius - 20 \times 10^{-6}\}]$
NIntegrate[Bz[Radius, height, radius, turns], \{height, 5 \times 10^{-6}, 24 \times 10^{-6}\}, \{radius, 0, Radius - 20 \times 10^{-6}\}]
Resistance[Radius, turns]

FIG. 35

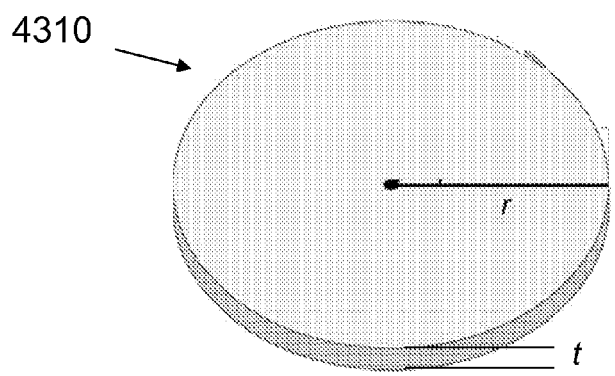
FIG. 43A
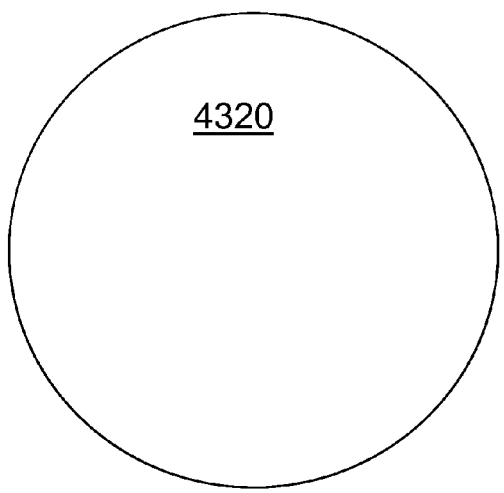 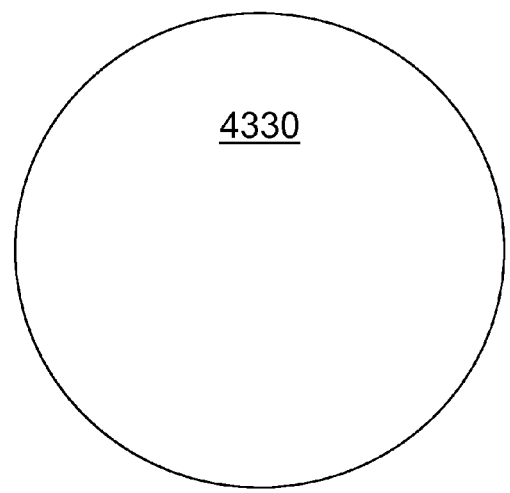
FIG. 43B			FIG. 43C

INTEGRATED PASSIVE IRON SHIMS IN SILICON

CROSS-REFERENCE TO RELATED APPLICATIONS

This application claims priority to and the benefit of copending U.S. provisional patent application Ser. No. 61/309,300 filed Mar. 1, 2010, which application is incorporated herein by reference in its entirety.

STATEMENT REGARDING FEDERALLY FUNDED RESEARCH OR DEVELOPMENT

The U.S. Government has certain rights in this invention pursuant to Grant No. Grant No. DMR0120967 awarded by the National Science Foundation.

FIELD OF THE INVENTION

The invention relates to permanent magnets in general and particularly to a permanent magnet field source that employs magnetic shims.

BACKGROUND OF THE INVENTION

Applications of magnetic fields in physics and engineering all rely heavily on accurate shaping of the magnetic field. In order to obtain uniform magnetic fields, it is common to use a magnet, such as a superconducting solenoid, that has dimensions many times larger than those of the volume in which a uniform field is required. For example, a magnet such as the 900 MHz magnet at the National High Magnetic Field Laboratory at Florida State University in Tallahassee, Fla. is an object measured in meters which has a region of uniform field measured in centimeters. In addition, conventional electromagnets and superconducting magnets require large power supplies, cooling facilities, and extensive controls to operate reliably.

There is a need for more efficient and less complex magnetic systems that can provide high field strength and high field uniformity.

SUMMARY OF THE INVENTION

According to one aspect, the invention features a magnetic apparatus. The magnetic apparatus, comprises a support structure configured to support two permanent magnets in defined relative orientation and location, the support structure comprising non-magnetic material, the support structure having an aperture defined therein for placement of a measurement element and a material of interest between the two permanent magnets; two permanent magnets supported by the support structure, each of the two permanent magnets having a first face of a first magnetic polarity and a second face of a second magnetic polarity, the two permanent magnets supported in defined relative orientation and location so as to provide a magnetic field between a respective first face of a first of the two permanent magnets and a second face of the other of the two permanent magnets; a magnetic material coupled between the second face of the first of the two permanent magnets and the first face of the other of the two permanent magnets; and at least one magnetic shim situated between the first face of the first of the two permanent magnets and the second face of the other of the two permanent magnets, the magnetic shim having all of its dimensions smaller than a smallest dimension of either of the first face of the first of the two permanent magnets and the second face of the other of the two permanent magnets.

In one embodiment, the two permanent magnets are NdFeB magnets.

In another embodiment, the two permanent magnets have circular first and second faces.

In yet another embodiment, the at least one magnetic shim comprises a semiconductor wafer.

In still another embodiment, the semiconductor is silicon.

In a further embodiment, the at least one magnetic shim comprises a magnetic material having a higher susceptibility than the semiconductor.

In yet a further embodiment, the magnetic material having a higher susceptibility than the semiconductor is iron.

In an additional embodiment, the magnetic material having a higher susceptibility than the semiconductor comprises nickel.

In one more embodiment, the magnetic material having a higher susceptibility than the semiconductor is present in a region that is defined photolithographically on the semiconductor.

In still a further embodiment, the magnetic shim further comprises a coil configured to carry an imposed current.

In another embodiment, the coil comprises copper.

In yet another embodiment, the coil is defined photolithographically on the semiconductor.

In still another embodiment, the magnetic apparatus further comprises a protective layer.

According to another aspect, the invention relates to a method of manufacturing a magnetic shim. The method comprises the steps of providing a semiconductor substrate, photolithographically defining one or more first locations on a surface of the semiconductor substrate for depositing a magnetic material; and depositing the magnetic material in at least one of the one or more first locations.

In one embodiment, the method further comprises the steps of photolithographically defining one or more second locations on a surface of the semiconductor substrate for depositing a non-magnetic conductive material; depositing the non-magnetic material in at least one of the one or more second locations; and providing electrical contacts for injecting current into the non-magnetic material.

In another embodiment, the one or more second locations define one or more loops.

In yet another embodiment, the method further comprises the step of providing a protective layer:

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

In FIG. 1 the upper curve represents the variation of magnetic field as a function of radial distance for an unshimmed configuration, and the lower curve represents the variation when two iron loops and a 1 inch diameter iron disc are provided on a silicon wafer placed between the discs.

FIG. 35 is a listing of the instructions in a MATH-EMATICA program.

FIG. 43A is a perspective view 4310 of a 2 inch diameter by 1 inch thick NdFeB N42 magnet, in which r=1 inch and t=1 inch.

FIG. 43B is a plan view of one circular face 4320 of the magnet illustrated in FIG. 43A.

FIG. 43C is a plan view of the other circular face 4330 of the magnet illustrated in FIG. 43A.

DETAILED DESCRIPTION

With the advancement of permanent magnets such as NdFeB, as a low cost alternative to superconducting electromagnets, the possibility of correcting the magnetic field has proven even more valuable. If a low cost, low operating power method were to emerge that allowed accurate shaping of the magnetic fields, numerous instruments would instantaneously become portable and low cost. An ideal example is NMR. If permanent magnets could be shimmed to a few tens of parts per million (ppm), NMR would become widely used as a field instrument, for example, for liquid detection. Many other uses are contemplated.

The approach taken here uses the cost effective techniques of silicon production to provide iron shims in the magnetic field to bend or correct the field to the desired direction and uniformity. Engineering the correct design is performed using a finite element magnetic modeling method. The design's shape can quickly be transferred to a silicon substrate. The designs obtained are more accurate than current methods of designing iron or nickel passive shims. Once fabrication is complete, the metal of choice can be deposited either by thermal evaporation or electroplating onto the silicon substrate. The wafer can then be placed on the surface of the magnet, with the magnetic force self aligning and holding the wafer securely in place. This method allows the designer to shape the magnetic fields into any shape desired. It also allows for linear scaling; shimming a 2 inch diameter disc magnet is performed exactly the same way as a 1 micron cube magnet. The lower limitation on the size of magnets that are correctable is related to the lithography methods available. Nanometer resolution is possible with electron beam lithography.

Fabrication and Design of the Individual Shims

Figure 1:
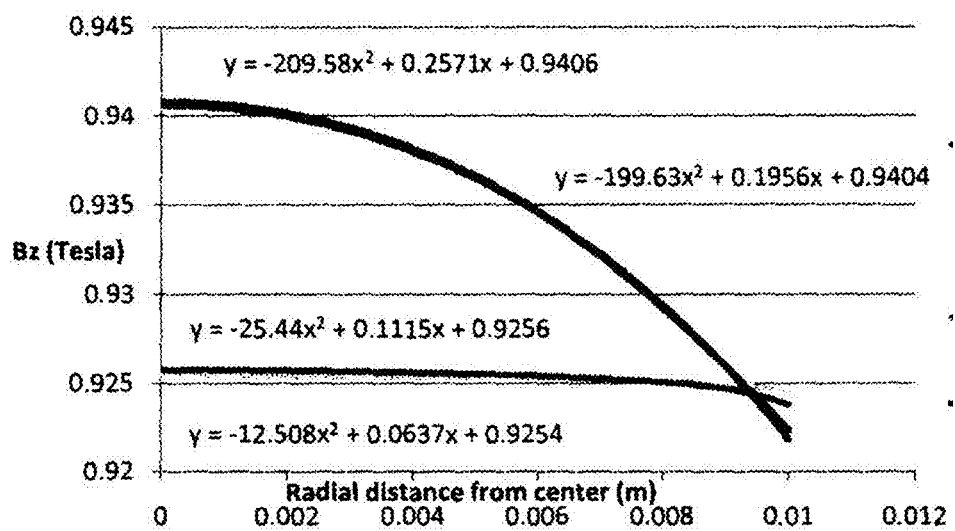
FIG. 1 is a diagram that illustrates a simulation that predicts the effects of shims on the homogeneity of the field between two magnetic discs.

As an example of correcting the magnetic field, an iron shim was constructed to homogenize the magnetic field created using two 2 inch diameter by 1 inch thick NdFeB N42 magnets separated by a gap of 6 mm and locked in a steel loop. Without magnetic field correction, simulations show that a 2 cm diameter by 4 mm thick disc shaped sample volume located in the center of the gap had a field homogeneity of 19500 ppm. By using 3 iron loops on the front side of a 2 inch silicon wafer and a 1 inch iron disc on the opposite side of the wafer, the field homogeneity could be corrected to 660 ppm. See FIG. 1. This is a 30-fold improvement. It is believed that additional iron rings could be designed to improve the homogeneity further.

Construction of this structure begins with lithographically imprinting the ring design onto the front side of the wafer using photoresist. For this particular shim Az 5214 E photoresist was used. With the photoresist pattern in place, dry silicon plasma etching was used to etch 20 to 30 microns into the silicon using an Oxford Instruments PlasmaLab System 100 ICP-RIE 380. After etching, iron was deposited into the etch trenches using thermal evaporation. A liftoff step then removed the photoresist mask and the unwanted iron. The process was then repeated on the back side of the silicon. The results obtained are similar to that shown in FIG. 18.

Improving Characteristics of Shims

The ease of fabrication can depend on the kind of metal deposited in the trench. Since the amount of magnetic field shimming is proportional to the susceptibility ($\chi$) and also proportional to the height, less material is required as the susceptibility of the material selected is increased. For example, by adding nickel to the iron and by annealing the deposited material after fabrication, less material will needed for a given magnetic field correction. Coatings of silicon dioxide or silicon nitride, using methods such as spin on glass or chemical vapor deposition, can be added post fabrication to provide protection of the metal from oxidation or environmental damage.

Figure 2:
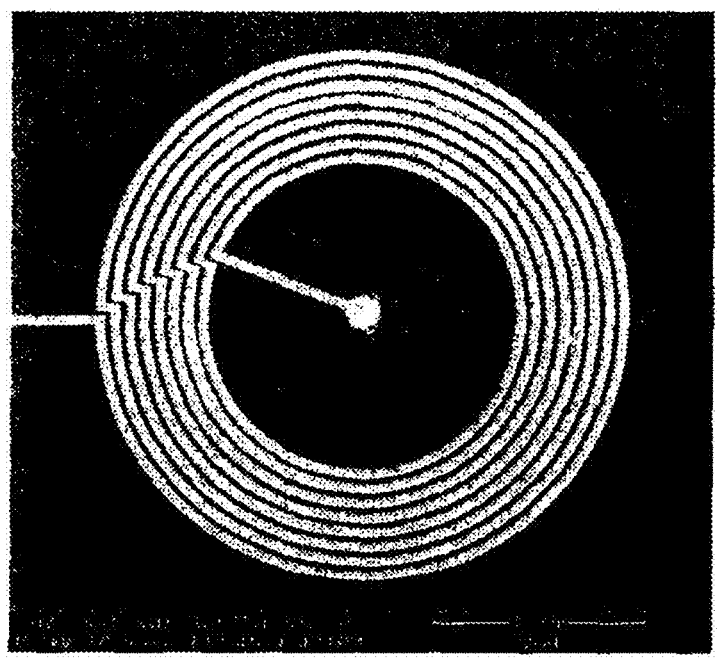
FIG. 2 is an image of an 8 turn copper coil imbedded in a silicon wafer for creating magnetic fields. The inner diameter of the coil is 1.5 mm.

In the absence of external magnetic shielding, the variation in the magnetic field of the Earth will limit the homogeneity that is achievable using the passive shims. As a numerical example, we assume the field of interest is 1 Tesla (1 T) and is shimmed to 1 ppb. Since the Earth's field is approximately 0.5 Gauss, rotation of a portable magnetic assembly in the Earth's magnetic field will change the magnetic field by 50 ppm. To correct this source of inhomogeneity, an active shim can also be integrated on the device. Using the same fabrication technique as for depositing the iron, electromagnetic coils can be integrated in the silicon. After the fabrication of the iron/nickel shims, a new layer of photoresist may be patterned and etched. Using copper instead of iron, conducting loops can generate magnetic fields such as coils in a Helmholtz configuration or the coils can be configured as many individual loops. As an example of this fabrication process, FIG. 2 is a diagram that shows an eight turn copper coil with an inner diameter of 1.5 millimeters.

Portable NMR

Components of a Portable NMR Apparatus

Tesla Magnetic Field and Shimming

The standard method of generating the magnetic fields for NMR is to use cooled superconductive electromagnets. Fields generated in this manner can exceed more than 20 T for volumes of several cubic centimeters. Although the sensitivity of NMR is proportional to the square of the field, the cost of these magnets can be upwards of several hundred thousand dollars. Such magnets occupy a very large physical space. In addition, there are requirements for providing power, cooling, and control circuitry, which adds to the expense and complexity of operating such magnets.

As an alternative, there is interest in utilizing low field permanent magnets due to their low cost and physical size. The objective of the design described here is to create a low cost, 1 T magnetic field with good homogeneity. The use of permanent neodymium-iron-boron (NdFeB) magnets in a portable device would eliminate the need to supply and to use electrical power.

Once the magnetic field is established, the second goal is to make a homogenous magnetic field over as large a volume as possible using passive shims. Shims are usually constructed using a highly susceptible magnetic material to alter the magnetic fields in the volume of interest, in a manner analogous to using optical lenses to bend light based on the material's index of refraction. A design for iron deposited in lithographically patterned silicon was developed to fabricate the passive shims precisely.

A magnetic circuit was designed to generate a 1 T field. The geometry of the design was set to minimize the inherent inhomogeneity while maximizing the magnitude of magnetic field attainable. An attractive geometry was chosen such that two of the NdFeB magnets, separated by an air gap, were connected using magnetic steel, in the so-called 'C' configuration. Due to the hysteresis of permanent magnets, the length and the area of the air gap separating the magnets alters the strength of the magnetic field. To determine the strength of the field, the magnetic field flux and magneto-motive force are simultaneously solved. The resulting magnetic field dependence of the magnet on the auxiliary magnetic field, H, is then plotted on the magnet's demagnetization curve to find the magnetic field in the air gap. To begin, we note that the magnetic field flux leaving the magnet's face is equal to the field flux entering the gap. We then calculate the magnetomotive force over the steel loop, the air gap and the magnets. Substitution using the two equations given below yields an equation for a straight line.

$$B_{gap} * A_{gap} = B_{mag} * A_{mag}$$

$$\oint H \cdot dl = 0 = H_{gap} * l_{gap} + 2 * H_{mag} * l_{mag} + H_{steel} * l_{steel}$$

$$B_{mag} = H_{mag} * \left( \frac{-2\mu_o \frac{l_{mag}}{l_{gap}} \frac{A_{gap}}{A_{mag}}}{\left(1 + \frac{l_{steel}}{\mu_{r-steel} * l_{gap}} \frac{A_{gap}}{A_{steel}}\right)} \right)$$

Assuming the gap area and the magnet area are matched, a numerical solution for a 2 inch diameter magnet yields a slope of $-5.083/l_{gap}$ in units of T/kOe. This result assumes a very large relative permeability of the steel. Placing this line, indicated with an arrow, in the demagnetization curve for a N42 (as shown in FIG. 3) or N52 (as shown in FIG. 4) magnet (available from K&J Magnetics, Inc.) allows for the determination of the magnetic field in the air gap from the intersection of the two lines.

Note that the demagnetization of the magnet depends upon temperature. Further, multiple correction factors should be added to account for non-idealities losses. However, once the slope is calculated for a given system and a correction factor determined, it should be constant for any strength magnet of similar dimensions. This calculation is most useful for considerations of magnet holder geometry.

Figure 3:
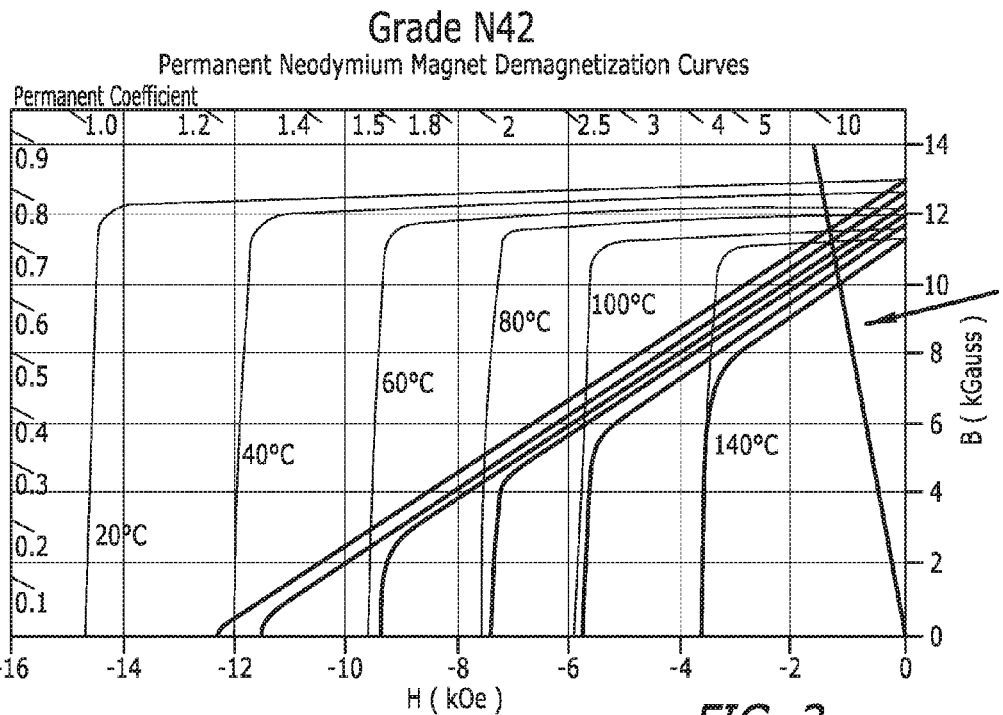
FIG. 3 is a graph of demagnetization curves for K&J Magnetics, Inc. NdFeB magnets of N42 material.

FIG. 3 is a graph of demagnetization curves for K&J Magnetics, Inc. NdFeB magnets of N42 material. The line indicated by the arrow is the theoretical demagnetization line. The intersection of this line with a temperature dependent behavior of the magnet indicates the magnetic field in the air gap.

Figure 4:
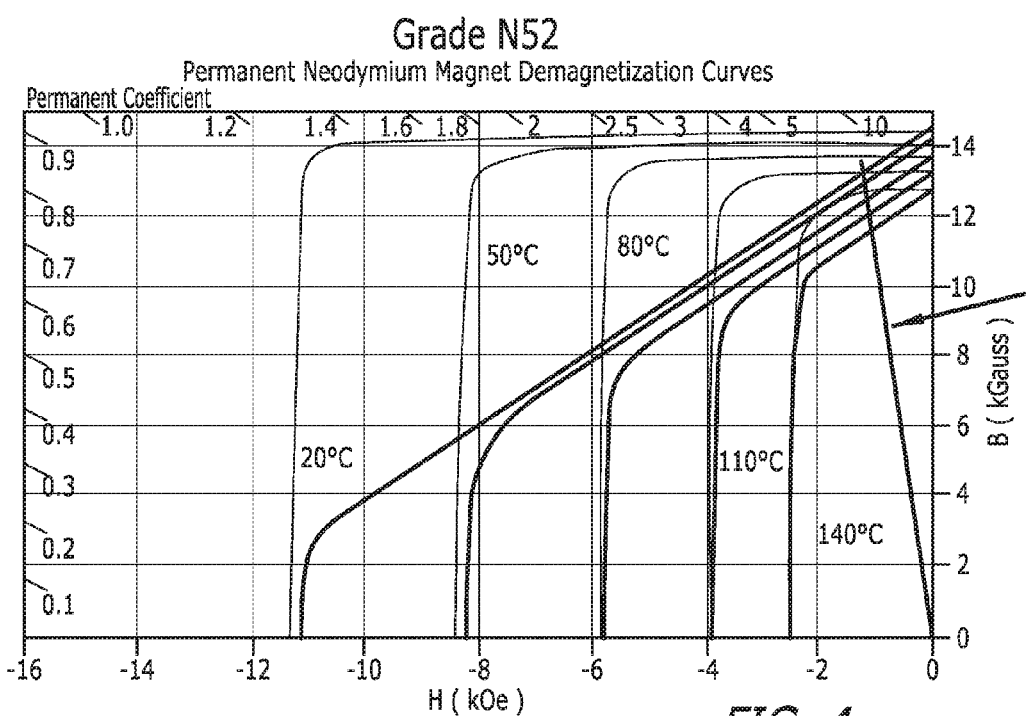
FIG. 4 is a graph of demagnetization curves for K&J Magnetics, Inc. NdFeB magnets of N52 material.

FIG. 4 is a graph of demagnetization curves for K&J Magnetics, Inc. NdFeB magnets of N52 material. The line indicated by the arrow is the theoretical demagnetization line. The intersection of this line with a temperature dependent behavior of the magnet indicates the magnetic field in the air gap.

Figure 5:
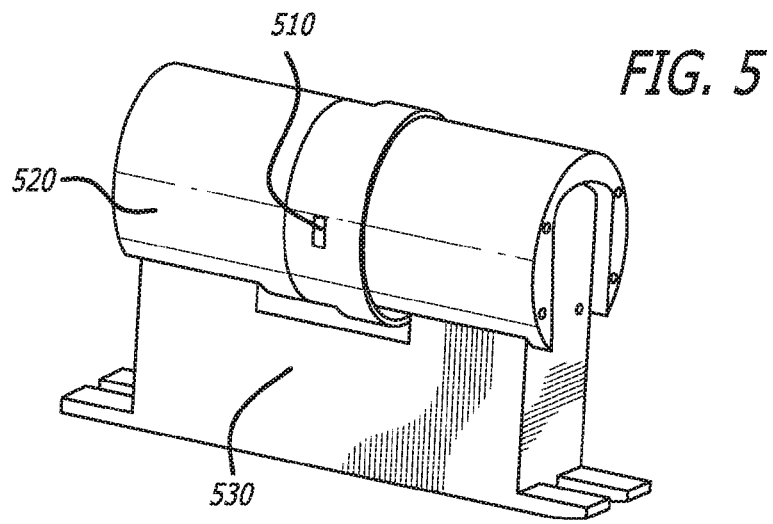
FIG. 5 is a perspective view of a model of the NdFeB magnetic circuit.

Using the calculation described above, a holder was designed for two 2 inch diameter, 1 inch thick NdFeB magnets. A Garolite fiberglass holder was constructed to maintain a magnet separation, or air gap, of close to 6 mm. The Garolite holder was constructed of 4 pieces so two magnets could be controllably brought together and placed in the steel loop. Garolite materials are available from Professional Plastics, Inc., 1810 E. Valencia Drive, Fullerton, Calif. 92831. FIG. 5 is a perspective view of a model of the NdFeB magnetic circuit. In FIG. 5, a port 510 is provided through which samples may be inserted into the magnetic field. The Garolite holder 520 and the steel loop 530 are also illustrated.

Figure 6:
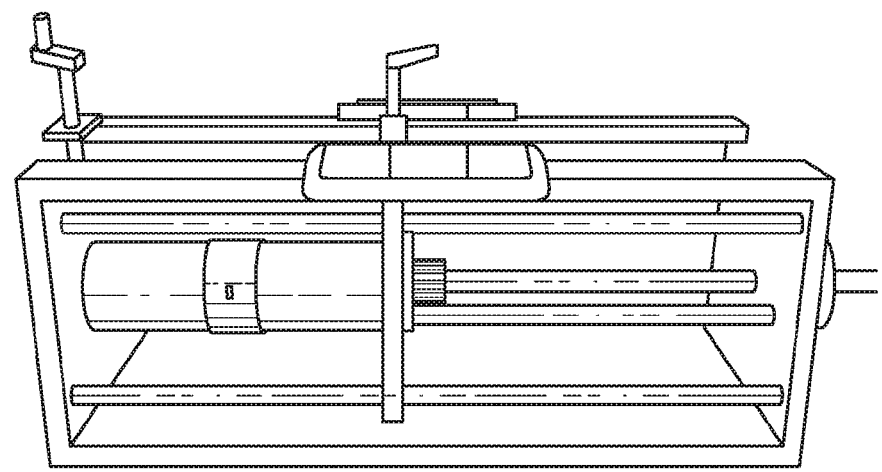
FIG. 6 is an illustration of the NdFeB magnetic circuit mounted in the apparatus which slowly brings the magnets together. All of the frame was constructed from non-ferromagnetic materials.

Precise control over the magnet was important because of magnet's strength. Placing two magnets in contact would require 232 lbs-force for N42 material and 278 lbs-force for N52 material to separate them again. To safely construct the magnetic circuit the following sequence was performed: A single magnet was locked between two holders. A vertical steel bar was slowly brought into contact with the backside of the magnet. The same operations were repeated on the second magnet. The two magnets were slowly brought together until the Garolite holders made contact with each other. The horizontal steel bar was slowly brought into contact with the two vertical steel bars. Once completely assembled, the magnet is held together with the majority of the magnetic field trapped in the steel loops and magnets or in the air gap. Typical measurements of the field just outside of the gap were approximately 5 Gauss (e.g., ten times the Earth's magnetic field). See FIG. 6.

Figure 7:
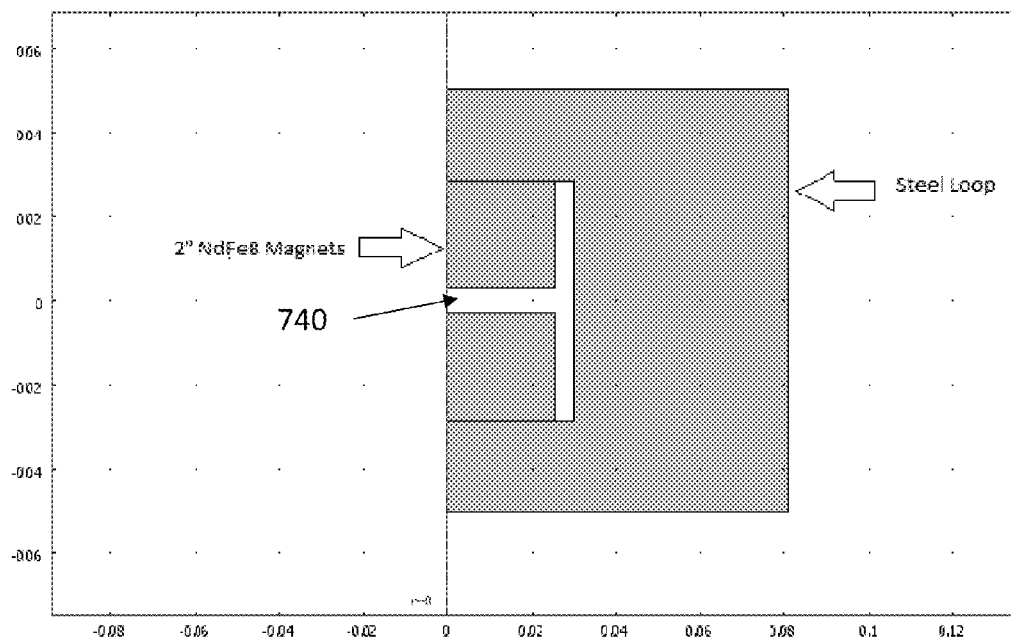
FIG. 7 is a diagram that illustrates the Comsol simulation for determination of the magnetic field.

The magnetic fields were simulated using the finite element magnetic solvers Comsol and FEMM. Simulations were performed in 2-D utilizing symmetry of the system in both cylindrical and Cartesian coordinates. The cylindrical simulations placed the r=0 axis along the center line of the magnets and the z axis along the direction of the magnetic field. This assumes symmetry along the theta axis which is not completely valid. This simulated configuration would have the iron loop completely encasing the Garolite holder. To correct for this assumption, simulations in a Cartesian coordinate system were used. The magnetic field across the center of the gap demonstrated a slight perturbation due to the fact that the iron holder was present. This perturbation will be discussed in further detail later. Several different terms were required to model the magnets, including the relative permeability ($\mu r$), the electrical conductivity ($\sigma$), the residual flux density (Br), and the coercive force (Hc). The conductivity was 0.667 MS/m. The residual flux density and coercive force for the N42 were 1.32 T and 875,820 A/m respectively and for the N52 were 1.48 T and 891,744 A/m respectively. These values were suggested by the manufacturer, K&J Magnetics, Inc. FIG. 7 is a diagram that illustrates the Comsol simulation for determination of the magnetic field. The sections containing the steel loop and the magnets are indicated. Free space 740 is shown.

Figure 8A:
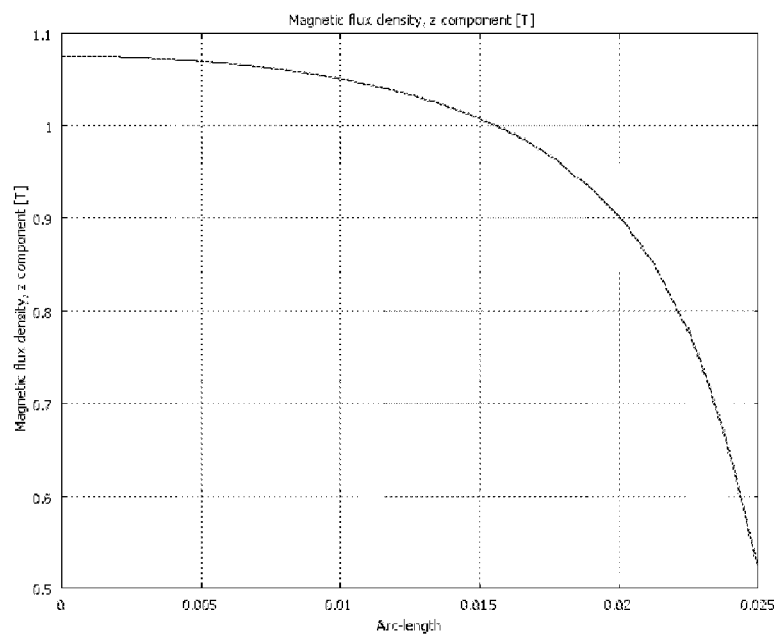
FIG. 8A is a diagram that depicts the homogeneity of the magnetic field, Bz, plotted radially as a function of arc length beginning at the center of the air gap as determined by simulation.
Figure 8B:
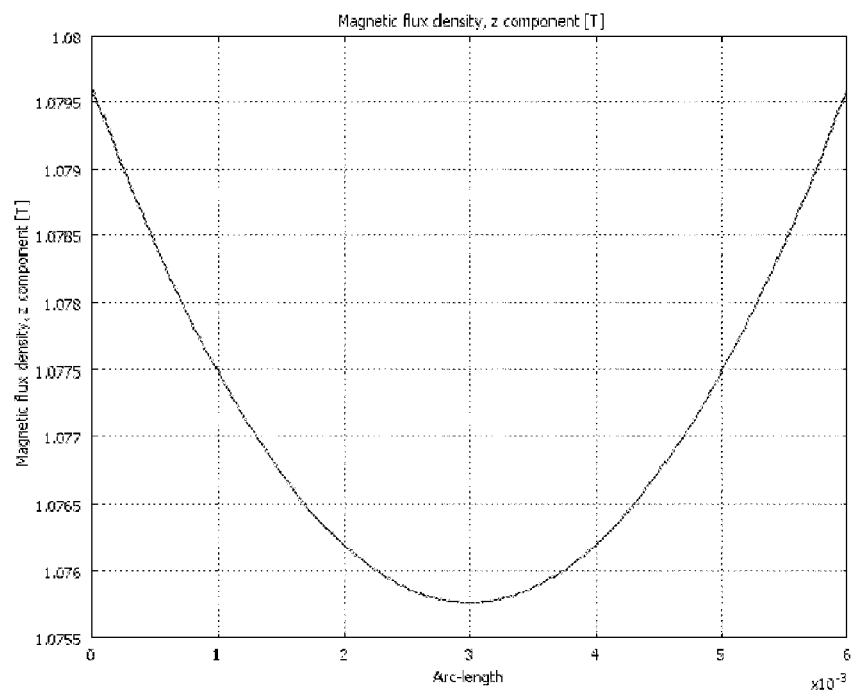
FIG. 8B is a diagram that depicts the homogeneity of the magnetic field, Bz, plotted azimuthally along r=0 as a function of arc length as determined by simulation.

The field homogeneity was determined by running simulations of the magnetic field. Typically, plots of the Bz field plotted both radially at z=0 (e.g., at the center of the air gap) and azimuthally at r=0 (e.g., along the center of the magnet) were used for characterization of the homogeneity defined here as (Bzmax−Bzmin)/(Bzmax) over a specified radial or azimuthal distance. In an unshimmed condition, the magnetic homogeneity was simulated in Comsol as 5273 ppm over a 1 cm diameter radially and 3568 ppm over the 6 mm azimuthal gap. Simulation using FEMM in radial coordinates yields a radial homogeneity of 4661 ppm and an azimuthal homogeneity of 2777 ppm. This level of inhomogeneity is unacceptable for conducting proton NMR experiments. Shimming would be required to provide acceptably uniform fields FIG. 8A is a diagram that depicts the homogeneity of the magnetic field, Bz, plotted radially as a function of arc length beginning at the center of the air gap as determined by simulation. FIG. 8B is a diagram that depicts the homogeneity of the magnetic field, Bz, plotted azimuthally along r=0 as a function of arc length as determined by simulation.

The magnetic field was measured using a LakeShore Model 455 single axis Gauss meter to verify the calculations and simulations. The Hall probe was mounted on a 3 stage micrometer and zeroed. Placement of the micrometer was measured using a caliper to be approximately square and the setup was measured on a wooden table (glued together) to minimize field distortions due to metal ferromagnetic objects. To ensure the probe's surface was normal to the magnetic field, the probe was rotated to reach a maximum field reading. Centering of the micrometer was an iterative process where the radial maxima was first determined in two directions (radial) then the minima was located azimuthally. This process was repeated 3 to 4 times until variations of the peak field were smaller than 10 µT. The micrometer was moved in increments of 500 µm for radial (250 µm for azimuthal) measurements noting the temperature of the probe. Typical measurements were conducted slowly, taking approximately 10 minutes, to prevent temperature fluctuations of the Hall probe. Using the MATLAB® curve fitting toolbox, the measured data was numerically fitted to solve for two components: coefficient for a parabolic curvature, and lateral offset of the field maxima. MATLAB® is available from The Mathworks, Inc., 3 Apple Hill Drive, Natick, Mass. 01760-2098. The maximum magnetic field was set at the highest value experimentally recorded. Due to the cylindrical symmetry of the magnetic field, a negative parabolic function was assumed. From the curve fitting, a lateral offset from zero of approximately 900 microns was seen with a 3558 ppm radial homogeneity over a 1 cm diameter.

Figure 9A:
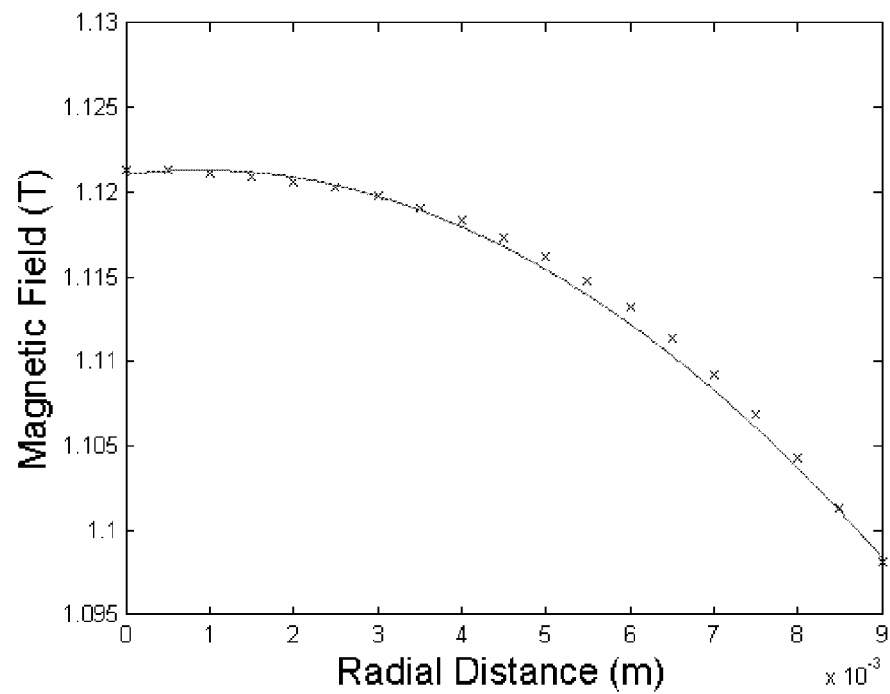
FIG. 9A is a graph showing the results of a Gaussmeter measurement of the magnetic field homogeneity of the magnetic field, Bz, plotted radially at the center of the air gap.

FIG. 9A is a graph showing the results of a Gaussmeter measurement of the magnetic field homogeneity of the magnetic field, Bz, plotted radially at the center of the air gap. Data points are depicted with an 'x'.

Figure 9B:
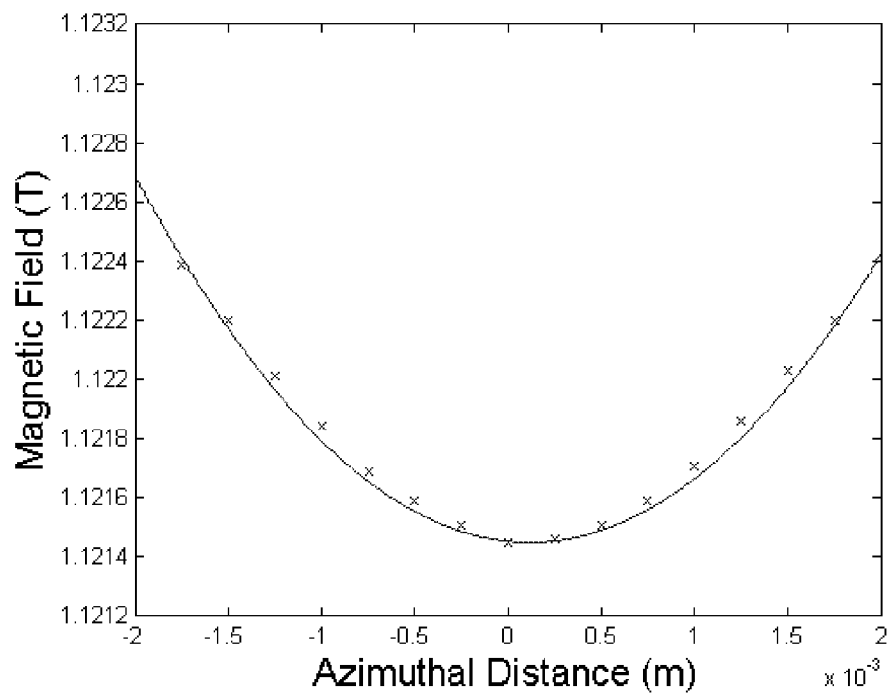
FIG. 9B is a graph showing the results of a Gaussmeter measurement of the magnetic field homogeneity of Bz plotted azimuthally along r=0.

FIG. 9B is a graph showing the results of a Gaussmeter measurement of the magnetic field homogeneity of Bz plotted azimuthally along r=0. Data points are depicted with an 'x'.

A second experiment was performed to determine the magnetic field's dependence on the air gap length. For this experiment, the magnets were separated in measured 1 mm increments. Upon separation, the center of the magnetic field was again determined using the Gaussmeter mounted on the micrometers to determine the azimuthal minima and radial maxima. As a second check of the length, the azimuthal micrometer was used to verify that the minima shifted only 0.5 mm. The data was plotted along with the FEMM simulated data and fitted to 1/(1+x) curves. The basis for using this function derives from using the air gap equation and approximating the demagnetization curve as linear.

$$B_{magnet} = \mu_o(1+\chi)H_{magnet} + B_r$$

and $$B_{gap} = -2\mu_o \frac{l_m}{l_{gap}} H$$

where Br is the residual magnetic field of the magnet, typically quoted by the vendors, $l_m$ is the length of the magnet, $l_{gap}$ is the length of the air gap and $\chi$ is the susceptibility of the magnet. The intersection of these two equations on the demagnetization curve occurs when the H fields are matched. This yields the following dependence on the air gap length:

$$B_{gap} = \frac{B_r}{\left(1 + \frac{\mu_r}{2}\frac{l_{gap}}{l_m}\right)}$$

Assuming that the magnet's length is 25.4 mm, the measured residual magnetic field was determined to be 1.363 T and the magnets relative permeability of 1.911 to an r-square value of 0.9975. Note that magnetic losses are typically represented by a factor multiplied by the ratio of the lengths. Unfortunately, this factor and the permeability term are inseparable, so the 1.911 was really a composite of the terms and should not be thought of as the actual permeability. The determination of the residual magnetic field, allowed for more precise simulations by using this value when describing the simulated magnets. Although adjusting the simulated magnets' residual magnetic field helped, comparison of the new simulated results with experiments still shows that that the simulated field decreases slightly faster as the air gap is increased.

Figure 10:
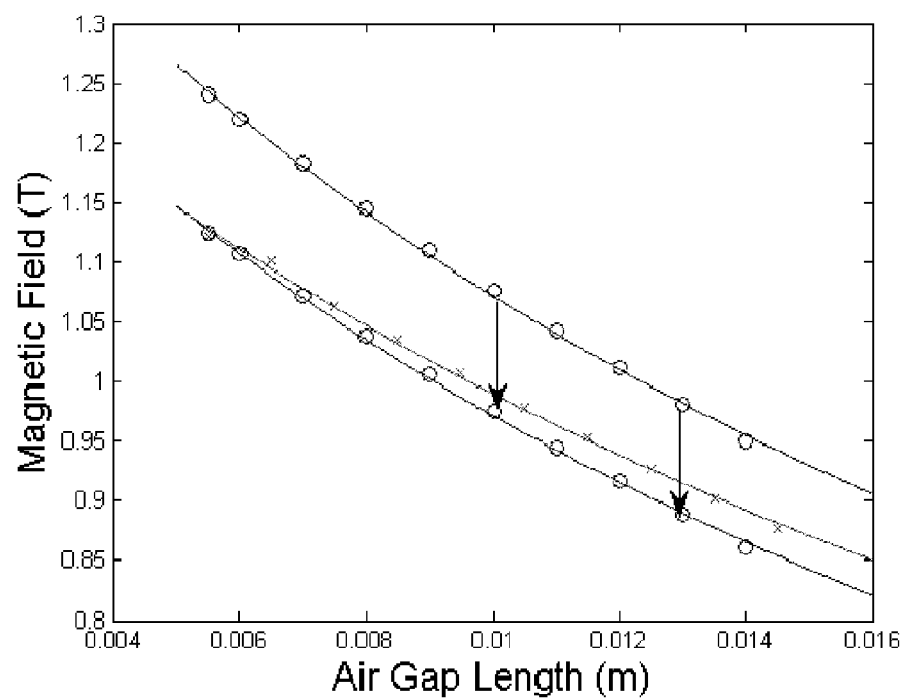
FIG. 10 is a graph showing the simulation (circles) and measurements (x) of Bz field as the air gap was increased.

FIG. 10 is a graph showing the simulation (circles) and measurements (x) of Bz field as the air gap was increased. The measurement was made using a LakeShore 455 Gaussmeter with the Hall probe mounted on a micrometer. The arrows show the change in simulation results as the magnets are adjusted from supplier's characteristics to the measured Br.

The large inhomogeneity demonstrated is unacceptable for proton NMR experiments. Magnetic field broadening decreases the peak signal intensity of the NMR by spreading the number of signal generators out over a wider frequency range. Field homogeneity should be as uniform as possible over as large a volume as possible. To perturb the field towards more homogeneity, devices referred to as shims are utilized. Shims can either be (and typically are) active electromagnets or passive ferromagnetic structures. Since portable applications are contemplated, active shims were not considered since they would draw a large amount of current continuously. Instead, this work describes the design and fabrication of passive shims attempting to make use of lithographic fabrication for precision patterning.

Two ferromagnetic shims have been designed to correct the field distortions. The first shim is a thin sheet of ferromagnetic material formed into a 1 inch diameter disc. This disc acts as a collimating magnetic lens to pull the magnetic flux away from the edges of the magnet and back to the center. This is needed since magnetic field lines in the center are repelled from each and are pushed to the outer edge of the magnet. As a second magnetic lens, rings of different diameters and different widths are positioned to assist in flattening the magnetic field to a greater level. Although the second lens performs functions similar to that of the collimating lens, it is dependent upon the collimating lens. The more the collimator pulls the magnetic field in, the easier it becomes for the shaping lens to achieve higher homogeneity. Hence, it is most logical to design the collimating lens first and then fit the second lens to provide tuning of the magnetic field.

Design of the collimating shim is similar to that of the classic electromagnetic problem of finding the correct coil diameters for a given separation of Helmholtz coils. The difference is that the passive shims are ferromagnetic and hence exhibit a nonlinear B-H curve. As the magnetic field passes perpendicularly through the face of the shim, a magnet current is established along the perimeter of the ferromagnetic material, given by Kb=M×n. The surface current around a disk is then similar to a loop of electric current. By placing a disc in the center of each magnet, a Helmholtz like configuration is established. Instead of a current I, a magnetic current of M*h is seen, where M is the magnetization of the disc and h is the thickness. Since the magnetization is proportional to $\chi$, to change the magnetization current one can either use thicker passive shims or material having a higher susceptibility.

Using this concept, finite element simulations were performed to optimize the field homogeneity by placing a passive ferromagnetic shim in the center of the magnet. This shim was simulated to have a $\chi$ of 5000 and the disk thickness was set to 7 microns. Although addition of a shim changes the width of the air gap, and hence the strength of the magnetic field, changes in the gap by tens of microns are relatively unnoticeable. The first parameter that was optimized was the diameter of the shim. By changing the diameter, the amount of flux being collimated as compared to the amount of flux leaving the magnet is varied. Looking at the two extremes suggests that an optimum diameter exists. If the shim is the same diameter of the magnet, no collimation occurs and the homogeneity is that of the magnet. If the shim is very small it will channel a high amount of flux and create a very strong field in the center. Running simulations indicated that an optimal shim diameter is located around 18 mm for a 25.4 mm diameter magnet. It is clear that if the shim is smaller by $\delta$, then a much greater homogeneity will be seen than if the shim was larger by the same $\delta$. For this reason, the majority of the shims designed were set to diameters of 25.4 mm.

Figure 11:
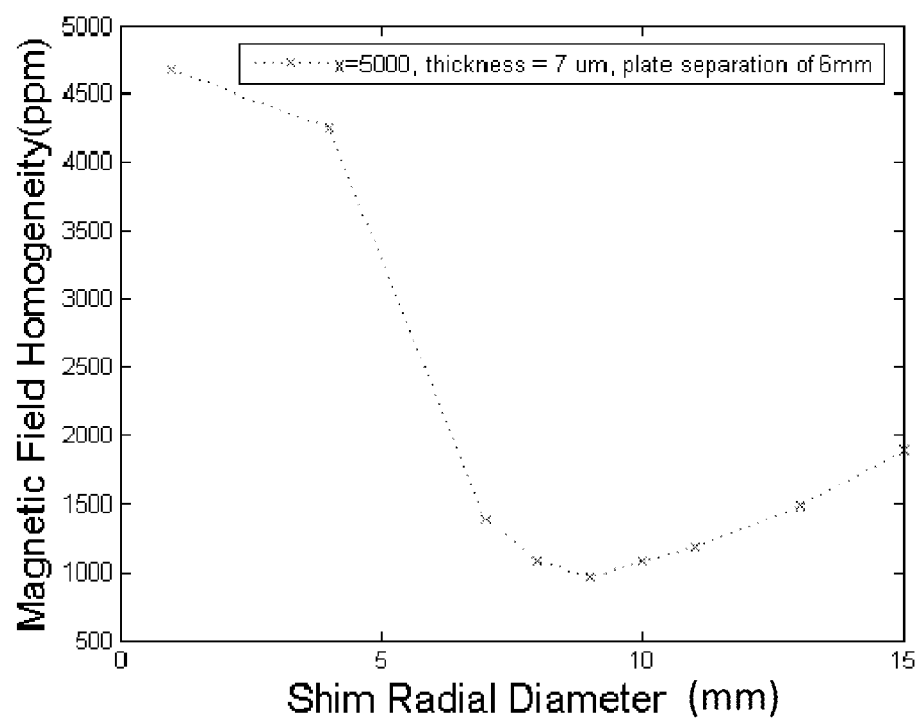
FIG. 11 is a graph that illustrates a simulation of Bz field radial homogeneity as the passive shim diameter is increased.

FIG. 11 is a graph that illustrates a simulation of Bz field radial homogeneity as the passive shim diameter is increased. The susceptibility used was 5000, approximately that of iron, and the shim thickness was 7 microns.

The field bending effect of the shim is proportional to both the susceptibility and the thickness. Therefore, doubling the susceptibility permits a reduction in thickness by half for the same effect. With this in mind, the optimum susceptibility-thickness ($\chi$-t) product was then varied to determine the maximum homogeneity. As expected, the stronger the $\chi$-t product, the more significant improvement in the homogeneity. For clarity, to achieve an homogeneity of better than 500 ppm a $\chi$-t product of approximately 0.18 is needed. For example, if $\chi$ were 5000, a thickness of 36 microns would be needed, but if $\chi$ were 20,000, only 9 microns is needed.

Figure 12:
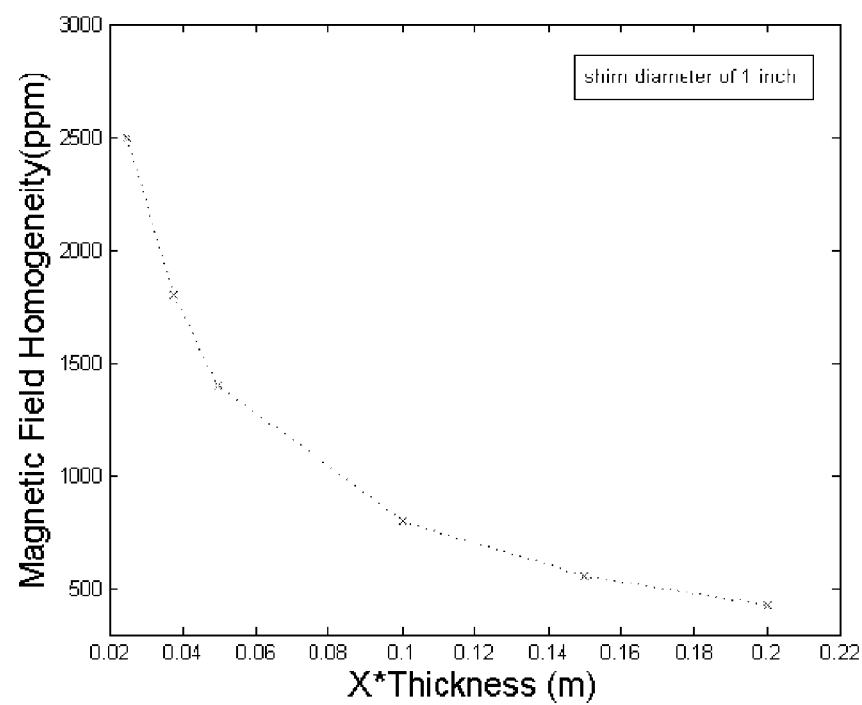
FIG. 12 is a graph illustrating the simulation of the Bz field radial homogeneity as the passive shim's susceptibility-thickness product is increased.

FIG. 12 is a graph illustrating the simulation of the Bz field radial homogeneity as the passive shim's susceptibility-thickness product is increased. The shim diameter used is 25.4 mm or 1 inch.

The second lens was comprised of a series of ferromagnetic rings. The physics behind this design is similar to magnetic field alteration using Helmholtz electromagnetic coils. As a magnetic field passes through the iron, a magnetic surface current is induced on the sides of the rings. The outside of the ring acts to increase the magnetic field whereas the inside ring generates a magnetic current opposite to that of the outside and acts to decrease the magnetic field. The combination of the two currents can act together to provide local additions to the magnetic field. The location of the addition is determined by the average radius of the ring whereas the amplitude of the field addition is determined by the width.

To describe this effect, assume two electromagnetic rings centered at radius 'r' and separated by a radius of $\delta$. Further, place the ring a distance of 'a' away from the origin. Have the outer ring conduct a positive current and the inner ring a negative current of equal magnitude. Then using elliptical integrals, the closed form solution can be written as:

$$\frac{B_z(\rho, z=0)}{I} = \frac{\mu}{2\pi} \left\{ \frac{1}{\sqrt{(R-\delta+\rho)^2+a^2}} * \left( K(k^2) + \frac{(R-\delta)^2-\rho^2-a^2}{(R-\delta-\rho)^2+a^2} E(k^2) \right) - \frac{1}{\sqrt{(R+\delta+\rho)^2+a^2}} * \left( K(k^2) + \frac{(R+\delta)^2-\rho^2-a^2}{(R+\delta-\rho)^2+a^2} E(k^2) \right) \right\}$$

Here, K and E are the elliptical integrals of the first and second kind respectively. If a ferromagnetic material is used instead of the electromagnetic loops, one can replace the currents I with M*h; this assumes that the ring has a uniform height.

Figure 13:
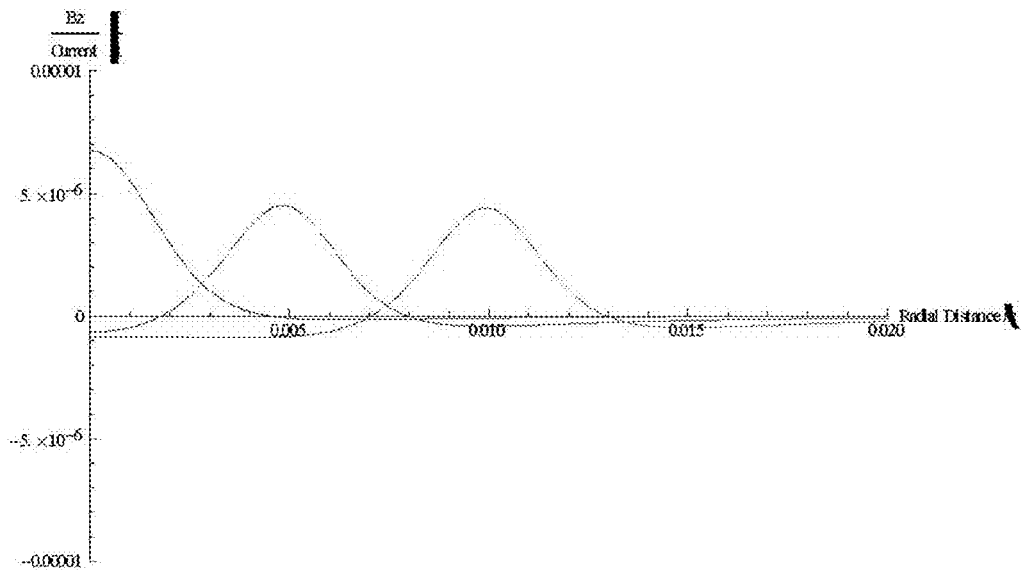
FIG. 13 is a graph that illustrates the effect of two current loops with equal but opposite currents, separated by a distance d=100 nm.

FIG. 13 is a graph that illustrates the effect of two current loops with equal but opposite currents, separated by a distance d=100 μm. The plot shows the addition to the magnetic field for average radii of 1 mm, 5 mm, and 10 mm.

Figure 14:
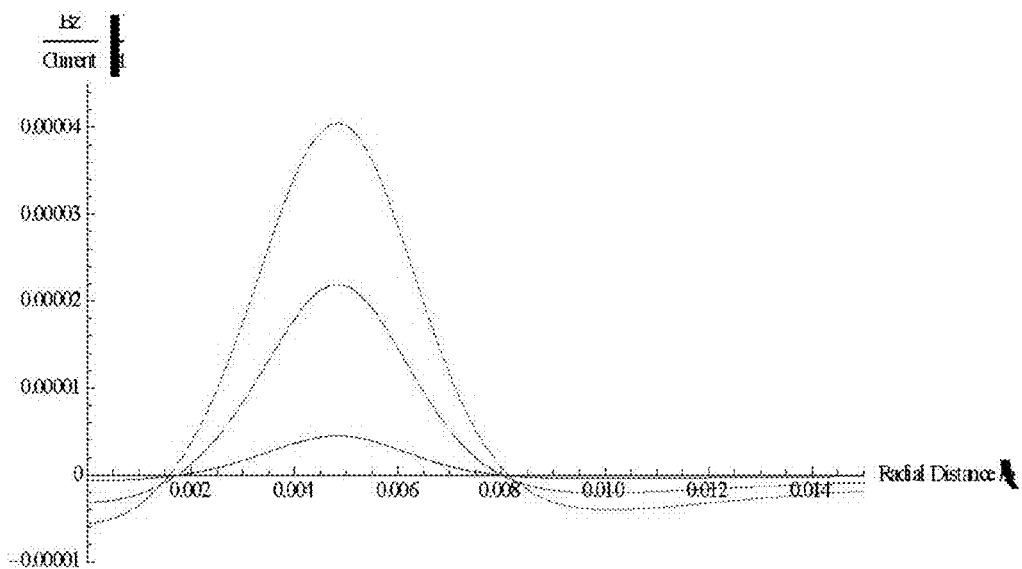
FIG. 14 is a graph that illustrates the effect of two current loops with equal but opposite currents, separated by a distance d=100 nm.

FIG. 14 is a graph that illustrates the effect of two current loops with equal but opposite currents, separated by a distance d=100 μm. The plot shows the addition to the magnetic field for average radii of 1 mm, 5 mm, and 10 mm.

Another method to increase the effect of the shim would be to increase the susceptibility of the ferromagnetic material or increase the thickness. The magnitude of the effect is useful because with 1 amp, the inhomogeneity can be shimmed past that achievable from the first magnetic lens. Using these design rules, and the assumption of a first magnetic lens with a thickness of 20 microns, diameter of 1 inch, and susceptibility of 5000, a set of 5 rings were designed to improve the field homogeneity. The rings were assumed to have a thickness of 10 microns and susceptibility of 5000. The average radii and widths of the rings are as follows: 1. 2.025 mm, 50 μm, 2. 3.05 mm, 100 μm, 3. 3.55 mm, 100 μm, 4. 4.35 mm, 150 μnm, and 5. 5.25 mm, 500 μm, respectively. These rings were designed using the finite element simulator previously described. With the design parameters stated, the magnetic field could be shimmed to less than 50 ppm. This value is approximately that of the Earth's magnetic field which would limit the ultimate resolution if not shielded.

Figure 15:
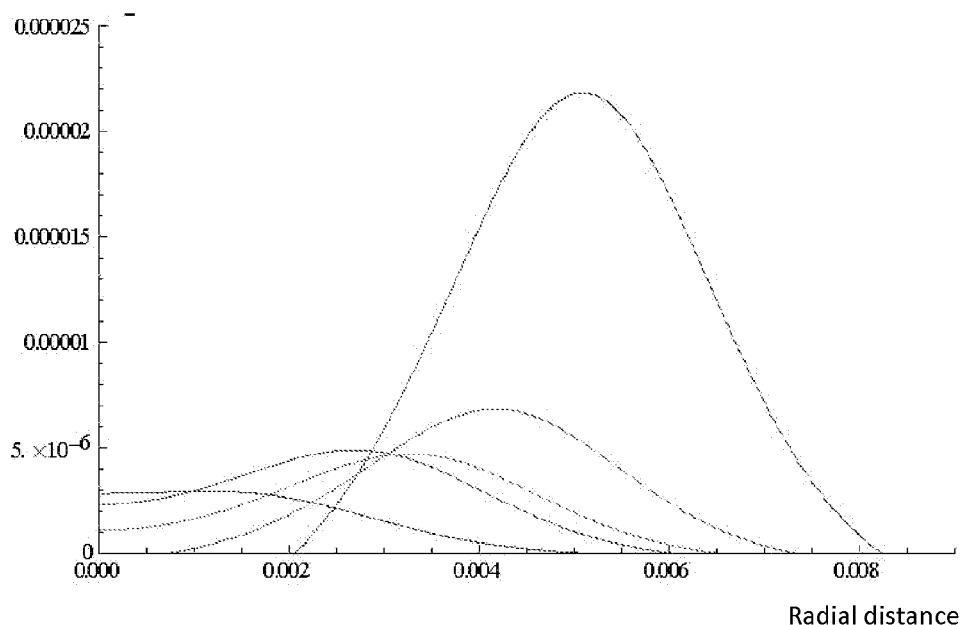
FIG. 15 is a graph that illustrates the effect of combination of 5 shims.

FIG. 15 is a graph that illustrates the effect of combination of 5 shims. The locations and widths were designed to counter the magnetic field inhomogeneity.

Figure 16:
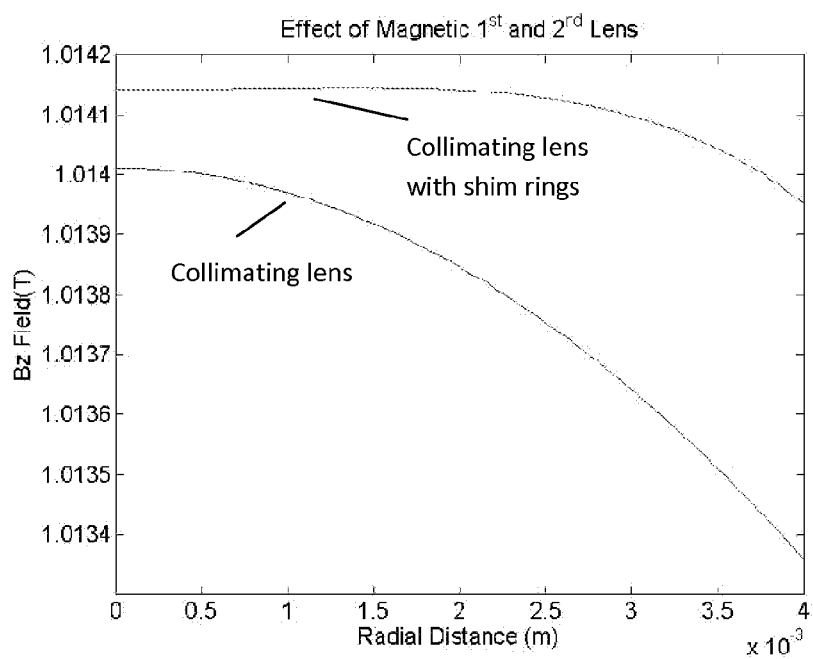
FIG. 16 is a graph that illustrates the effect of adding the shim rings to the collimating lens.

FIG. 16 is a graph that illustrates the effect of adding the shim rings to the collimating lens. The combined effect is a 6 mm diameter range with homogeneity of 50 ppm. These curves were generated using a finite element magnetics simulator.

With the design of both the collimator lens and shim rings complete, we now turn to issues of fabrication for both structures. Since the shim rings require precision structures and placement on the micron scale, silicon fabrication was implemented instead of traditional machining. One of the advantages of the cryogenic silicon etch described herein is the high selectivity of the etch rate of photoresist over that of silicon. This advantage can be utilized for improving metallization lift-off on silicon.

Typically when lifting off a metallization layer using photoresist, care must be taken in obtaining resist sidewalls that are vertical or even slightly reentrant, and the photoresist has to be substantially thicker than the deposited metal layer. The fabrication approach described here transfers the difficult liftoff profile requirements from the photoresist to the cryogenic silicon etch. We have demonstrated that the sidewall profile is very easy to control and reproducible by optimizing the cryogenic etch parameters. The high selectivity improves the relative height between the top of the photoresist to the silicon surface being metalized thereby permitting thicker metal layers to be deposited. This enables creation of passive magnetic shims and electromagnetic coils by deposition of thick layers of iron into silicon. It is believed that this is the first time that one has used the etch mask as also the metallization lift-off mask for deposition of thick metal layers on silicon.

To fabricate the iron rings, two inch p-type silicon wafer were cryogenically etched simultaneously to approximately 20 microns in depth to define the ring patterns with the various radii and widths described earlier. Etch conditions are described hereinafter. With over 1 micron of photoresist remaining, iron was then thermally evaporated at a rate of 8 A/sec to a final thickness of approximately 6.5 microns. To reduce stresses from magnetic anisotropy, a 1 inch NdFeB N42 magnet was placed behind the wafer during evaporation. Following metallization, liftoff was then performed in acetone. Thicker depositions typically failed due to the film stresses in the iron layer. It was typical to see layers peel up under what optically appeared to be tensile stress. This observation is consistent with the thermal coefficients of expansion for iron as compared to silicon.

Figure 17:
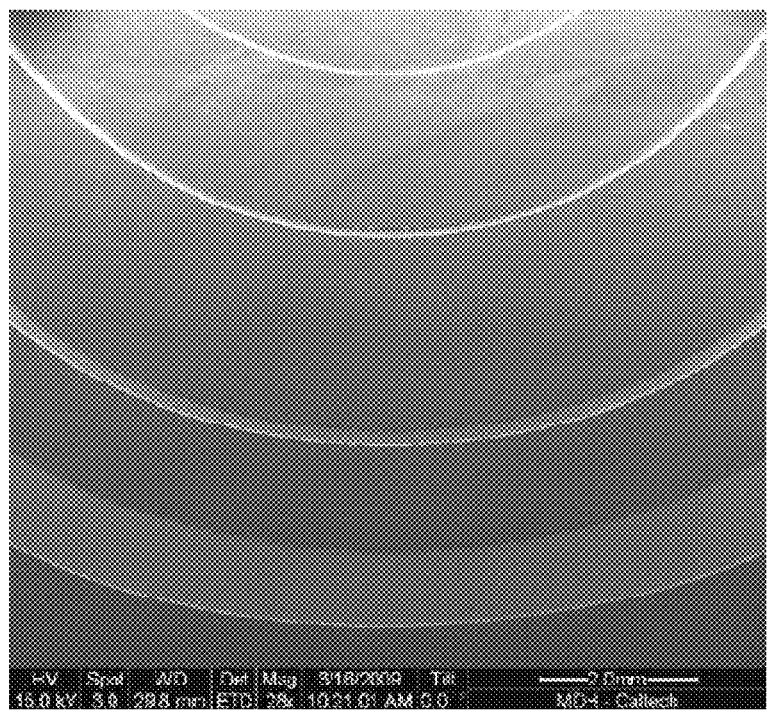
FIG. 17 is an SEM image of iron shim rings embedded in a silicon substrate.

FIG. 17 is an SEM image of iron shim rings embedded in a silicon substrate.

Figure 18:
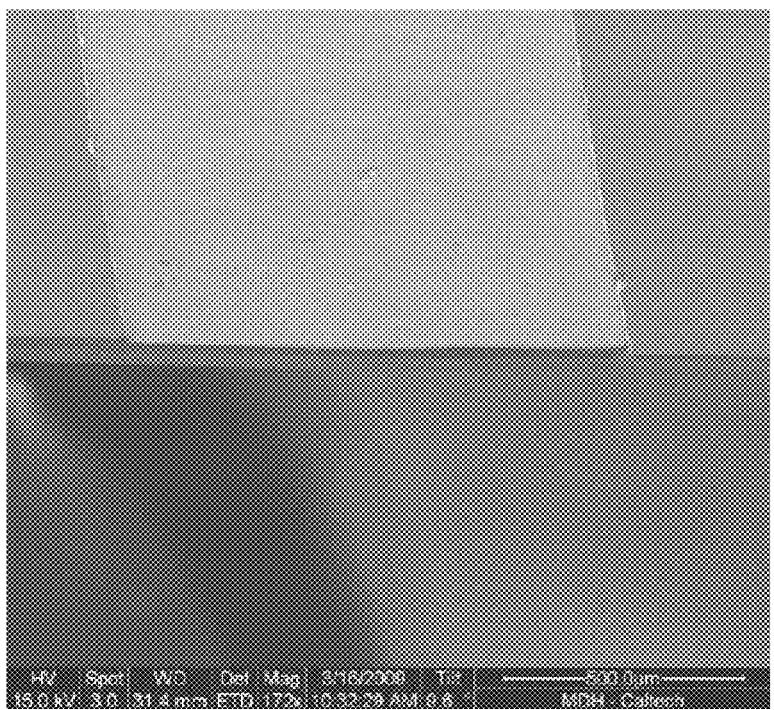
FIG. 18 is a cross sectional SEM image that shows the thickness of the iron layer.

FIG. 18 is a cross sectional SEM image that shows the thickness of the iron layer. The iron was evaporated into cryogenically etched silicon and the metallization liftoff procedure performed using the etch mask; this eliminated the need for patterning thick photoresist.

To reduce the stresses at the expense of a more granular iron film, the wafer was cooled during evaporation. This cooling was achieved by placing a 4 inch diameter copper disc, ½ inch thick, behind the substrate Immediately before evaporation, the copper was cooled in a liquid nitrogen (LN$_2$) bath, transferred to the evaporation chamber, and the chamber immediately pumped down. The copper then acted as a heat sink to remove the heat from the evaporated iron. This allowed for 3-5 microns of evaporation to be performed several times to achieve the desired film thickness of 10 microns. In addition to temperature, the trenches were broken up into segments which retained the ring structure. The basis for this was to reduce the volumetric stress of a deposited layer.

Figure 19:
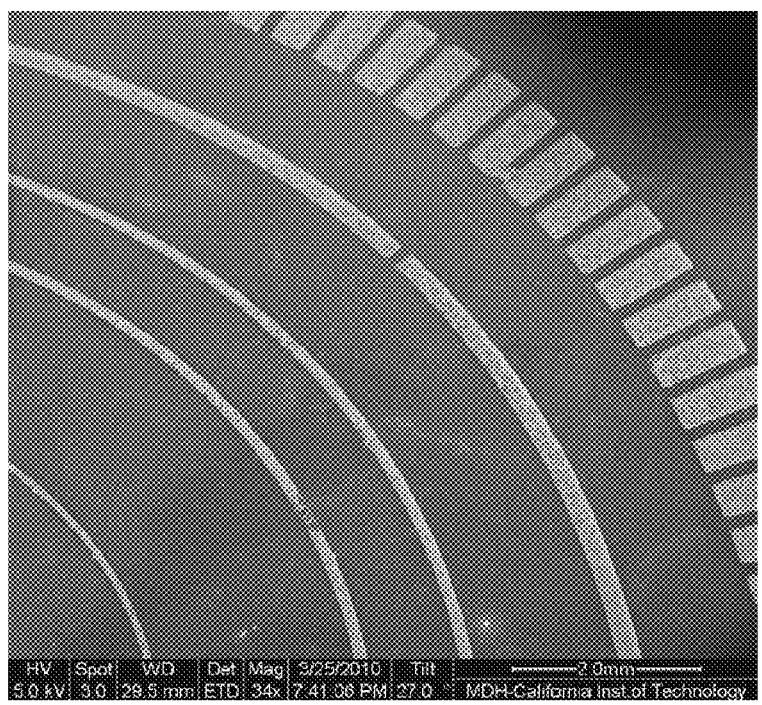
FIG. 19 is an SEM image of iron shim rings embedded in a silicon substrate.

FIG. 19 is an SEM image of iron shim rings embedded in a silicon substrate.

Before the ring structure could be magnetically tested, a collimating lens was required to improve the homogeneity to closer to a 1000 ppm. Since the metallization layer to achieve 10 microns already proved a challenge from stresses, deposition of a 1 inch diameter 20 micron thick iron layer was not attempted. As an alternate route, highly ferromagnetic metallic glass (available from the Metglas Corporation, 440 Allied Drive, Conway, S.C. 29526) was used. Metallic glass is a metal alloy in which its amorphous state is locked in during cooling; essentially there is no long range crystalline order. Typically this is done by rapid cooling of the metal from a liquid state. Metglas 2605S3A was selected for several of its properties. The quoted as cast susceptibility was >20,000, the thickness was 0.7 mils (17.8 microns), and the saturation induction was 1.4 T.

Initial testing has shown mixed results. Although the Metglas proved to be highly ferromagnetic from observation in the magnetic field, measurements using the Hall Probe indicated otherwise. When the Metglas was placed in the field, a very strong attraction was noted between the magnet and the shim. Moreover centering the shim resulted in curling of the edges of the shim to normal with respect to the magnet. This indicates that the shim is forcing the field to push field lines closer together. It could be interpreted that this implies a more homogeneous state. This most certainly is not a conclusive observation since the curling of the shim should also indicate that the field is reducing the reluctance across the gap by having a ferromagnetic material traversing it. Magnetic field measurements indicated that the Metglas did have some effect. One layer, which was expected on theoretical grounds to flatten the field, actually made the field less homogeneous. Two layers appeared to make the field more homogeneous. Measurements over many shims under different mounting conditions had the same enigmatic results. Some configurations resulted in field flattening and some improved the field.

Figure 20:
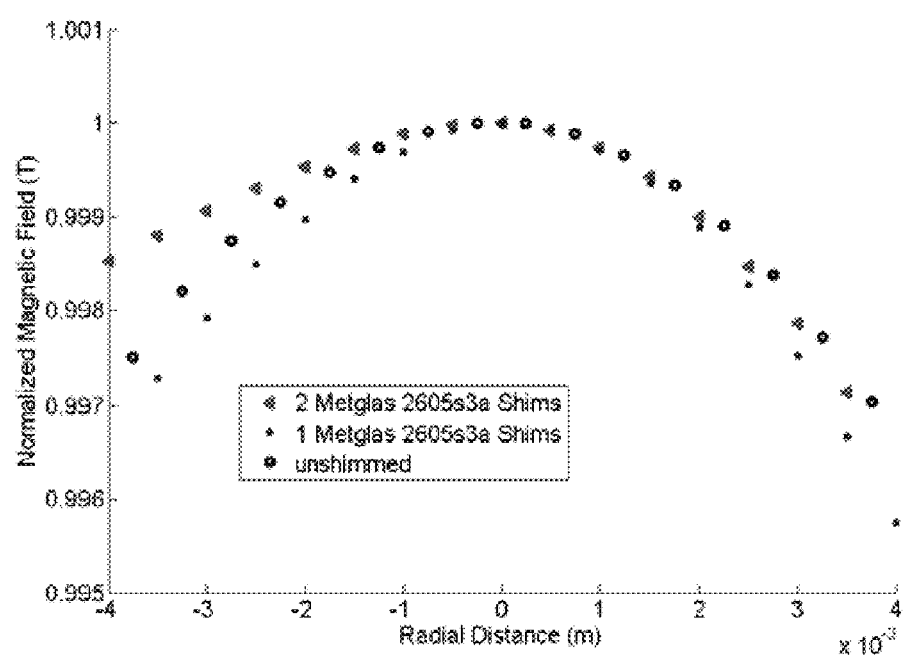
FIG. 20 is a graph that illustrates the results of magnetic field measurements using a Hall Probe mounted on a micrometer stage

FIG. 20 is a graph that illustrates the results of magnetic field measurements using a Hall Probe mounted on a micrometer stage. Three conditions were tested, an unshimmed field (large circles), using one 1 inch diameter Metglas 2605S3A shim (small circles), and using two 1 inch diameter Metglas 2605S3A shims (triangles).

It is quite likely that difficulty in measuring the homogeneity could be due to the measurement device itself or part of the holder design. Although the probe is rated to measure 1 Gauss in a 3 Tesla field, it is not clear whether having the probe in the field actually perturbs the field homogeneity. It is known that when shimming NMR machines most operators use the measurement of the NMR spectra as the determining factor for the true field homogeneity. Unfortunately, it is impossible to test the second lens before the first lens is in place. The main reason is that the purpose of the second lens was to take a known field and shim it to homogeneity. Placing the second lens in the magnetic field and expecting it to operate correctly is akin to using a telescope objective without the main telescope mirror. It is possible the field is homogeneous enough over a large enough sample volume that it would be possible to measure spectra and use this to determine the effects of shim additions. Indeed, it was noted that over a 1.5 mm, a sub 100 ppm field homogeneity exists. Setting up a method to accurately measure the magnetic field to high homogeneity is the next logical step for this project.

Copper Planar Microcoils

Transmission and detection coils for use in a portable NMR were fabricated on silicon. The fabrication process can reduce the cost and increase the repeatability of the microcoil by creating the microcoils in silicon rather than winding copper coils from wire. The microcoil is designed to also act as a resonator whose resonance is placed according to the gyromagnetic ratio of the nuclei being detected. We now describe in detail the design of the microcoils both as an electrical component in a circuit as well as for use in electromagnetic field generation. A fabrication sequence describes how to create these microcoils in silicon using a single lithographic step. Finally, the DC and AC electrical characteristics as well as the electromagnetic field are measured and described for the coils. This planar microcoil is designed for a NMR applications but this or other microcoils useful for other applications can be provided using the same principles and procedures. By way of example, this design is CMOS compatible so an ideal use might be increasing the inductance for use in an integrated switcher or for a microfluidic susceptibility detector.

The microcoil design was intended to optimize the coil signal to noise ratio (SNR) for use in NMR measurements and apparatus. In NMR measurements, changing the nuclei that are observed or changing the strength of the polarizing magnetic field can changes the Larmor frequency at which the signal is observed. The signal to noise ratio of the measurement signal is proportional to the field produced by the coil, the noise generated by the Johnson resistance of the coil, and the number of nuclei being observed or volume of the sample. Hence, the design of the geometry of a NMR coil is initially based on maximizing the SNR of a signal at a chosen frequency. The frequency of operation then is used to determine the required inductance and resistance of the coil.

$$SNR = \frac{\gamma^3 \hbar^2 * B^2 * \beta * I(I+1) * N_{sample}}{3 * \sqrt{\frac{4 * \text{Resistance} * \Delta f}{\beta}}} * \int \frac{B_1}{\text{current}} dV$$

Here $\gamma$ is the gyromagnetic ratio ($\gamma$=42.58 MHz/T for protons), h-bar is Planck's constant, B is the polarizing magnetic field created by the permanent magnet setup, I is the spin (½ for proton), $N_{sample}$ is the number of spins generating a signal per unit volume, Resistance is the total resistance of the coil, $\beta$ is Boltzmann's constant times the temperature, $\Delta f$ is the bandwidth of the circuit used, and the integral describes the magnetic field generated by the planar microcoil ($B_1$) over the sample volume per Amp.

To achieve the highest SNR from geometrical considerations, the optimization of the microcoil involves the resistance and the integrated terms. To some extent the bandwidth is also modified, but an external matching circuit was utilized to further reduce the bandwidth. To numerically model the microcoils, the classic NMR SNR equation is recast into a more transparent form.

$$SNR = \frac{\omega * M_o}{\sqrt{\frac{4*\text{Resistance}*\Delta f}{\beta}}} * \int \frac{B_1}{\text{current}} dV$$

$$M_o = \frac{N_s \gamma^2 \hbar^2 I(I+1) B_o}{3 K_B T} \sim 0.0032021 \text{ Amp m}^{-1}$$

To accurately model the electromagnetic field of the coil, FEMM was employed to simulate the microcoil around the frequency of interest. The simulations were performed for an increasing number of coil turns to determine the optimal number. This simulation permits coupling of the coil's turns and accounts for skin depth in the copper conductor (approximately 9.5 microns at 50 MHz) and assumed a 1.15 T polarizing field ($\omega=\gamma*Bo\sim50$ MHz). Four starting radii were selected to test the silicon based microcoil detection, namely radii of 980 microns, 730 microns, 480 microns and 230 microns. All of the coils had wire widths of 40 microns at 70 micron center-to-center spacing based on what was achievable from the fabrication process. The sample volume of all the simulations incorporated a volume of diameter equal to that of the first turn of the microcoil and a height determined by a radius to height ratio of 0.08. From the simulations, several parameters were retrieved, most importantly the integral over the volume, the resistance at high frequency, the magnetic field the microcoil can generate from 1 Amp of current, and an approximation of the signal size to be detected.

Figure 21:
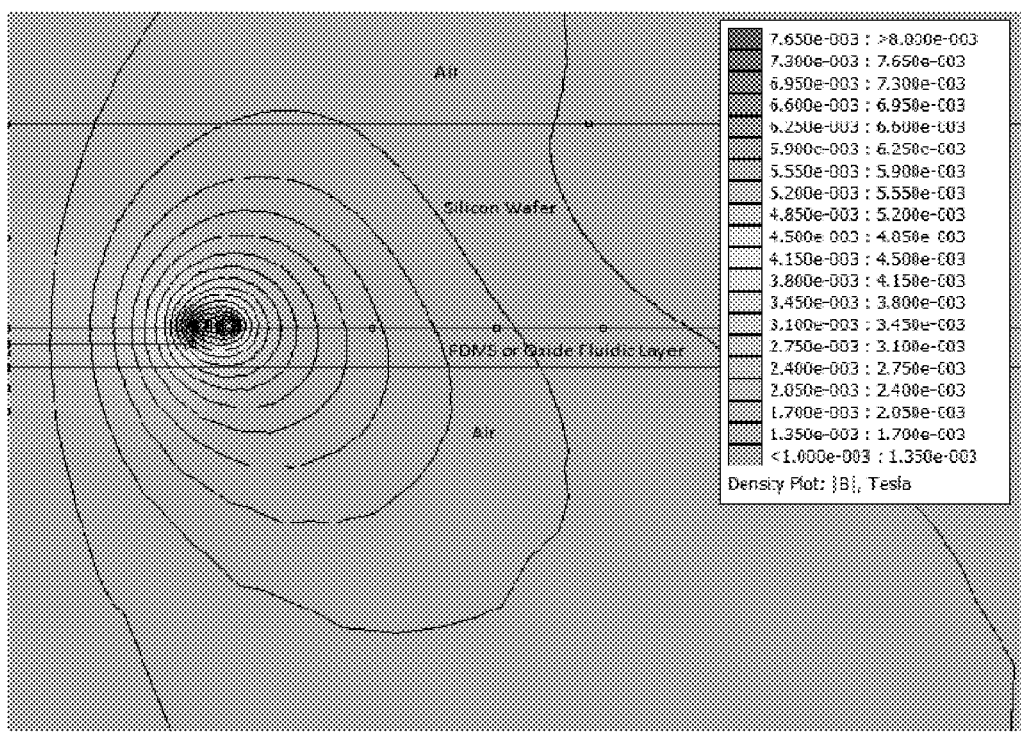
FIG. 21 is a graph that illustrates a result of a simulation of Bz field for a 500 micron radius planar microcoil.

FIG. 21 is a graph that illustrates a result of a simulation of Bz field for a 500 micron radius planar microcoil. The simulation was run at 50 MHz for a 2 turn microcoil. These FEMM simulations allowed for the signal to noise ratio to be optimized.

Figure 22:
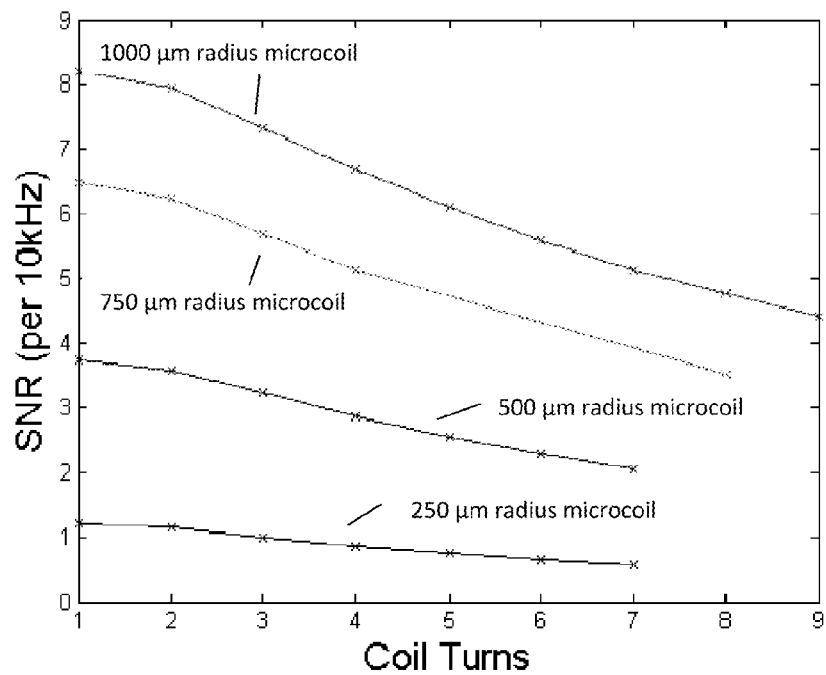
FIG. 22 is a graph illustrating the results of a simulation of the signal to noise ratio for various microcoils.

FIG. 22 is a graph illustrating the results of a simulation of the signal to noise ratio for various microcoils. These FEMM simulations allowed for the signal to noise ratio to be optimized Using the simulations it was determined that for the 1000, 750, and 500 micron radius coils, 2 turns would be used and only 1 turn would be used for the 250 micron radius coil. As a verification of the simulations, an analytical solution was numerically calculated in Mathematica for the 2 turn coils. To calculate the magnetic field, the full solution to a planar coil was used.

$$B_z(\rho, z) = \sum_{n=0}^{1} \mu * \frac{\rho}{\sqrt{((R+\delta n)^2 + z^2}} * \left( EllipticK\left[ \frac{4*(R+\delta n)*\rho}{\sqrt{((R+\delta n)^2 + z^2}} \right] + \frac{((R+\delta n-\rho)^2 - z^2)}{((R+\delta n-\rho)^2 + z^2)} * EllipticE\left[ \frac{4*(R+\delta n)*\rho}{\sqrt{((R+\delta n)^2 + z^2}} \right] \right)$$

The summation was used to account for each of the coil's turns but did not include the inductive coupling from one turn to another. A similar summation was used to calculate resistance with the width of the wire limited to 2 times the skin depth for copper (9.4 microns). A final assumption was that the substrate has no conductivity which would otherwise degrade the inductance. Although these three assumptions assist in making the calculations tractable, they do not accurately model the coils. In fact the skin depth adds considerably more resistance at 50 MHz than modeled and the reduction of the inductance due to coupling with the substrate will be seen to dramatically decrease the 'Q' of the inductor. However, the calculation does serve as a validity check for the simulations. The results from the calculations are seen in the following table:

| Microcoil Radius (μm) | Calculated Signal (μV) | Simulated Signal (μV) | Calculated Resistance (Ω) | Simulated Resistance (Ω) |
|---|---|---|---|---|
| 1000/2 turn | 0.6269 | 0.3744 | 0.793 | 1.476 |
| 750/2 turn | 0.3293 | 0.2387 | 0.602 | 0.9803 |
| 500/2 turn | 0.1297 | 0.1 | 0.410 | 0.526 |
| 250/1 turn | 0.0153 | 0.0119 | 0.096 | 0.0647 |

Using the optimum coil radii, the fabrication sequence was designed. The fabrication sequence began as a standard lithography and plasma etching sequence. On a P+3 inch silicon <100>wafer, a 1.6 micron thick AZ 5214e photoresist is patterned in accordance with the fabrication recipe given below. The pattern comprised two sets of the 4 different diameter coils on a soda-lime glass and chrome photo mask. The mask was generated using a Heidelberg Laser Mask writer with approximately 1 micron resolution. Using this photo mask, the resist on the silicon was optically patterned Immediately following the patterning, a cryogenic etch was performed to achieve a pattern approximately 25 microns in depth. Since the cryogenic etch has such a very high selectivity, most of the photoresist remained.

Figure 23:
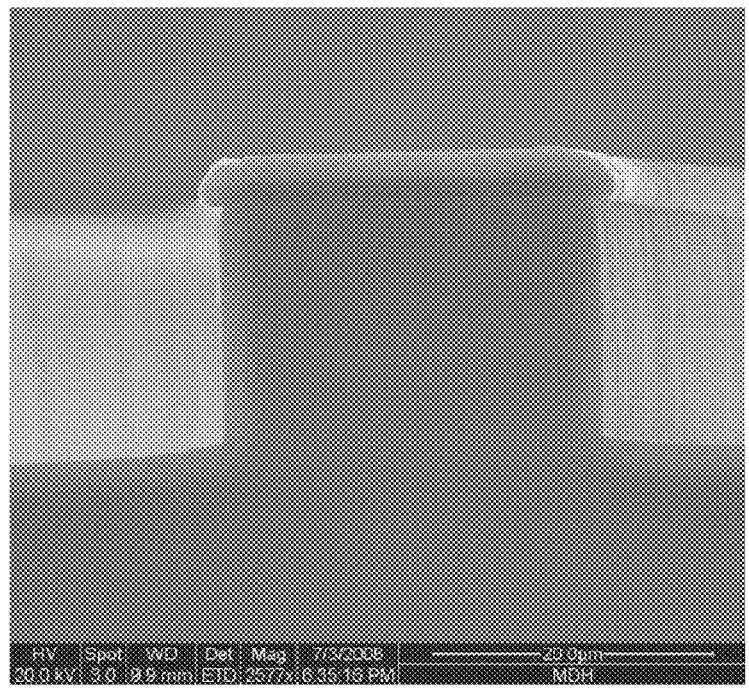
FIG. 23 is a cross sectional SEM of a microcoil ridge separating two trenches where copper was to be deposited

FIG. 23 is a cross sectional SEM of a microcoil ridge separating two trenches where copper was to be deposited. The cryogenic silicon etch was masked with 1.6 microns of resist. Following the etch, an insulating 1.6 micron thick silicon dioxide layer was PECVD deposited.

At this point, one of two techniques of low temperature chemical vapor deposition (CVD) was used to deposit an insulating layer of silicon dioxide. This insulating layer prevented the current from leaving the copper wire runs and going to the substrate. This layer also created a parasitic capacitance which will be discussed later. The first deposition technique utilized an inductively coupled plasma reactive ion etcher (ICPRIE) fitted with a gas ring around the table. This unique gas ring configuration permits the injection of 5% silane diluted with nitrogen, 5%-$SiH_4/N_2$, into the chamber for creation of a plasma. When nitrous oxide, $N_2O$, is injected into the plasma the result is a recombination of the silicon atom and the oxygen atom to create a silicon dioxide deposition. This technique is referred to as inductively couple plasma chemical vapor deposition (ICP-CVD). This method of deposition is advantageous since no forward (Fwd) power is required and the table temperature is approximately 90 C. The low temperature prevents the resist from cross-linking or burning. A very dense layer of silicon dioxide deposits at a rate of approximately 18 nm per minute and typical deposition times were 2 to 8 minutes; 8 minutes results in a layer approximately 140 nm thick. To improve the adhesion of metal to the silicon dioxide layer, a 2 min deposition of amorphous silicon was deposited. The recipe for depositing amorphous silicon is the same as that for silicon dioxide but the nitrous oxide flow was stopped.

| Microcoil Radius (μm) | Calculated Signal (μV) | Simulated Signal (μV) | Calculated Resistance (Ω) | Simulated Resistance (Ω) |
|---|---|---|---|---|
| 1000/2 turn | 0.6269 | 0.3744 | 0.793 | 1.476 |
| 750/2 turn | 0.3293 | 0.2387 | 0.602 | 0.9803 |

-continued

| Microcoil Radius (μm) | Calculated Signal (μV) | Simulated Signal (μV) | Calculated Resistance (Ω) | Simulated Resistance (Ω) |
|---|---|---|---|---|
| 500/2 turn | 0.1297 | 0.1 | 0.410 | 0.526 |
| 250/1 turn | 0.0153 | 0.0119 | 0.096 | 0.0647 |

A second technique for silicon dioxide deposition uses plasma enhanced chemical vapor deposition (PECVD). This deposition instrument was also an Oxford Instruments Plasmalab System 100 but is physically different from an ICPRIE in that it does not have an ICP coil. Instead, the machine uses a capacitively coupled plasma (CCP) with both a 13.56 MHz RF power supply and a low frequency power supply. The low frequency supply has an output low pass filter which limits the output frequency to less than 100 KHz. The addition of the lower frequency power supply permits stress built up during the deposition to be controlled. Since the plasma is not as dense as the ICPRIE, the table temperature is required to be much hotter to achieve a similar density in the layers when compared to the ICP-CVD. Standard deposition temperatures are 350 C to 400 C. Since photoresist was used in this process, the temperature was limited to less than 150 C, reducing the quality of the layer. Typical deposition rates using this machine were 65 nm per minute and were typically run for 20 seconds. Again to achieve better adhesion between the metal and oxide, by stopping the nitrous oxide gas flow a thin layer of amorphous silicon was deposited.

| | | | |
|---|---|---|---|
| $SiH_4/N_2$ | 450 sccm | HF Power | 15 W |
| $N_2O$ | 750 sccm | Fwd Power | 0 |
| Temperature | <150 C. | Pressure | 1 T |
| $SiH_4/N_2$ | 280 sccm | HF Power | 50 W |
| | | Fwd Power | 0 |
| Temperature | <150 C. | Pressure | 2 T |

Figure 24:
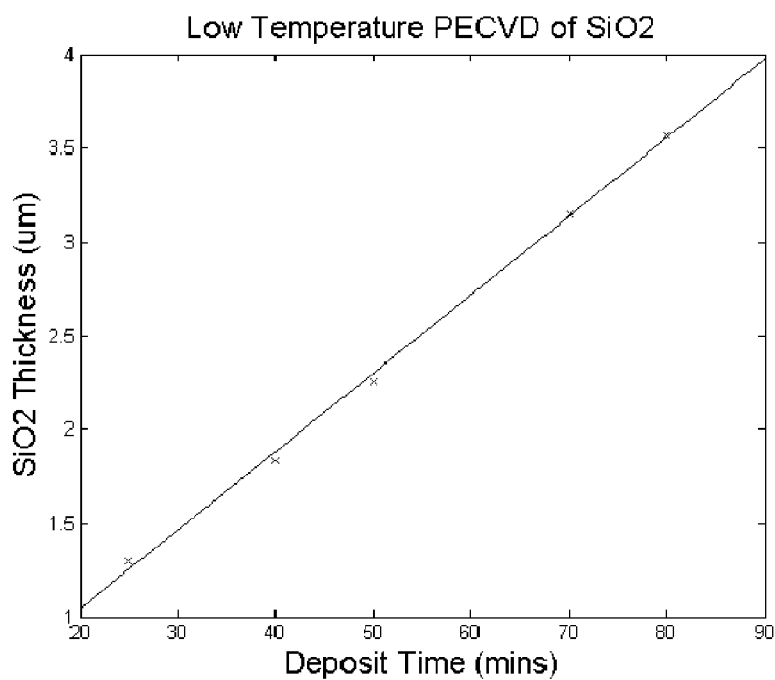
FIG. 24 is a graph showing deposition thickness of low temperature PECVD of silicon dioxide versus time

FIG. 24 is a graph showing deposition thickness of low temperature PECVD of silicon dioxide versus time. Data was fitted to a linear deposition rate of 42 nm per minute with an offset of 207 nm. This data is untested for less than 20 minute deposition times.

Upon completion of the silicon dioxide insulating layer, one additional step was needed before deposition of the copper. This step comprised exposing clean silicon substrate at the end of the innermost wire run. Having clean, highly doped P-type silicon and copper come into contact, an ohmic tunnel-junction could be made. An ohmic contact is made by one of two methods. In one case, one matches the metal and semiconductor work functions to lower the barrier height or by making a very thin depletion region where the current can tunnel through. For this type of device, since copper was used to reduce the expense, the junction width was instead reduced by using highly doped silicon. The barrier width was approximated as an ideal Schottky diode using a P+ silicon doping of $10^{19}$ cm$^{-3}$, a copper work function of 5.10 V and a silicon work function of 4.72 V.

$$W_d \sim \sqrt{\frac{2*\epsilon_{si}}{q*N_A}\left(\frac{E_g}{q} - (\phi_{cu} - \chi_{si})\right)} \sim 9.8 \text{ nm}$$

This contact permitted the current travelling through the coil to be shunted to the substrate and picked up on the backside of the wafer, thereby eliminating the need for a bridging contact from the center of the coil to the outside of the coil. This approach created a truly planar silicon microcoil where microfluidic systems or another silicon wafer could be bonded to the surface. By etching a pillar at the end of the innermost wire, a diamond scribe could be brought in to fracture off the pillar, thereby exposing clean silicon.

Figure 25:
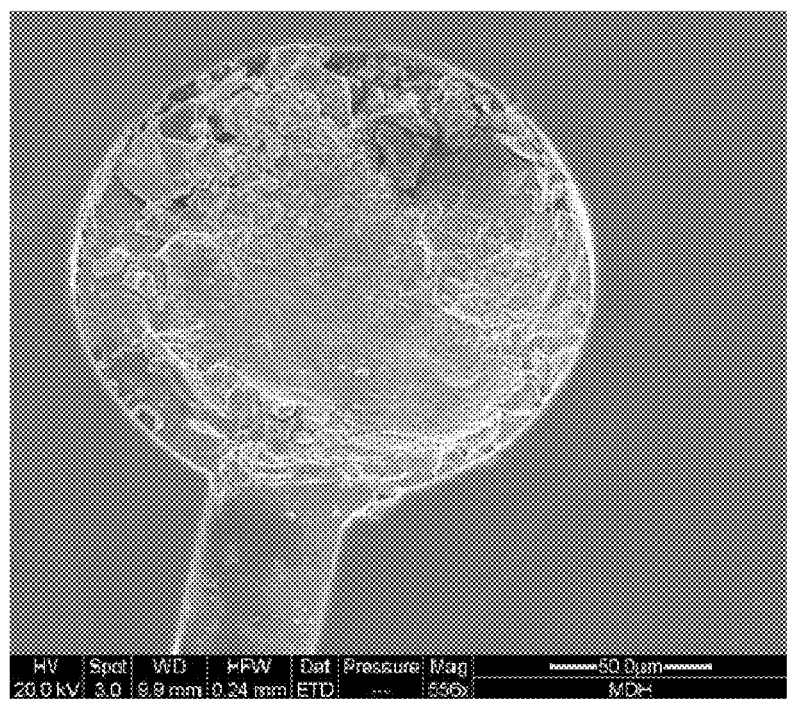
FIG. 25 is an SEM image of the center contact after being mechanically cleaved off and having copper thermally evaporated over the clean P+ silicon.

FIG. 25 is an SEM image of the center contact after being mechanically cleaved off and having copper thermally evaporated over the clean P+ silicon. This contact established an ohmic tunnel-contact from the copper microcoil to the substrate, eliminating the need for a bridging wire and the required additional fabrication steps.

Immediately following the removal of the contact pillar, a thermal evaporation of copper was performed. The thermal evaporator used was pumped down to approximately $5\times10^{-6}$ Torr. The evaporation boats used were R. D. Mathis RDM-WBAO-3 alumina coated tungsten boats allowing for approximately fifteen 50 g copper slugs to be evaporated at the same time. This permitted approximately 5 microns per run to be deposited. Evaporation rates were approximately 20-40 Angstroms per second with a plate temperature set at 41 C. Upon completion of the evaporation, the sample was allowed to cool for two hours before vacuum was broken. To perform liftoff, the sample was immersed in acetone where the metal on top of the resist would peel off, usually in one single foil sheet leaving the copper in the etched trenches. To create the backside contact, the wafer was floated in buffered hydrofluoric acid (BHF). The term "floating" denotes that the wafer was placed on top of the HF solution and would float on the top of the fluid so only the back side of the wafer made contact with the solution. The backside silicon was cleaned for 1 minute, rinsed with deionized water (DI), dried with $N_2$, and placed in the evaporator where 100-300 nm of copper was then evaporated.

Figure 26:
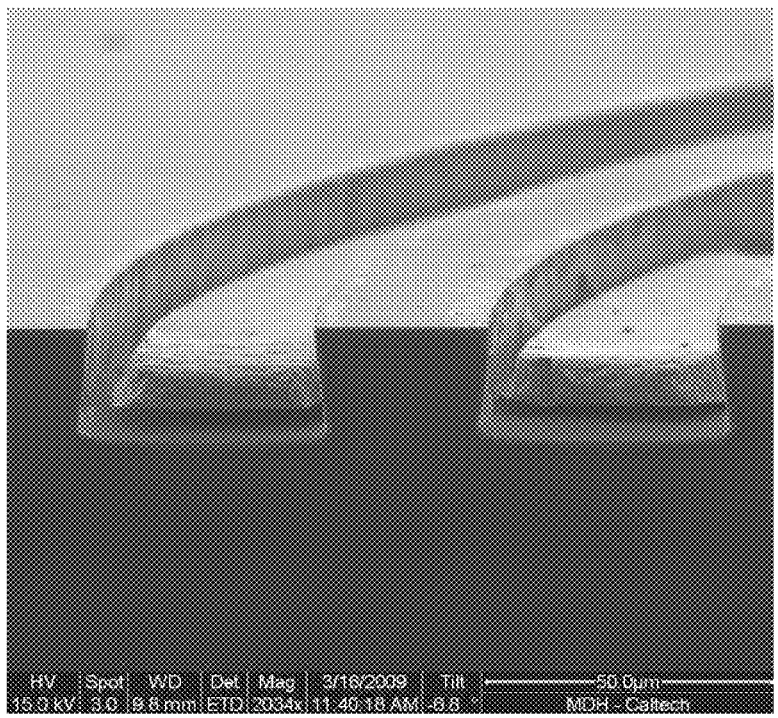
FIG. 26 is a cross sectional SEM image of copper wire runs embedded in the etched silicon wafer and insulated from the substrate using a silicon dioxide CVD layer.

FIG. 26 is a cross sectional SEM image of copper wire runs embedded in the etched silicon wafer and insulated from the substrate using a silicon dioxide CVD layer.

At this point the wafer could be cleaved to separate the planar microcoils for testing. This fabrication sequence is significantly less complicated than any other sequence currently used to produce microcoils in silicon. This fabrication sequence permits a high level of repeatability and reduces the fabrication costs per wafer. In addition, by shunting the current to the substrate, the need for multiple realignments or lithography steps is eliminated since the bridging contact is not needed. This also permits wafer bonding or PDMS bonding to be achieved. Finally, although only 1.6 microns of photoresist was used, up to 15 microns of thermally evaporated copper could be lifted off. Typically, if metallization is to occur, a thick photoresist layer is required which is approximately 3 times thicker than the desired metal thickness.

Figure 27:
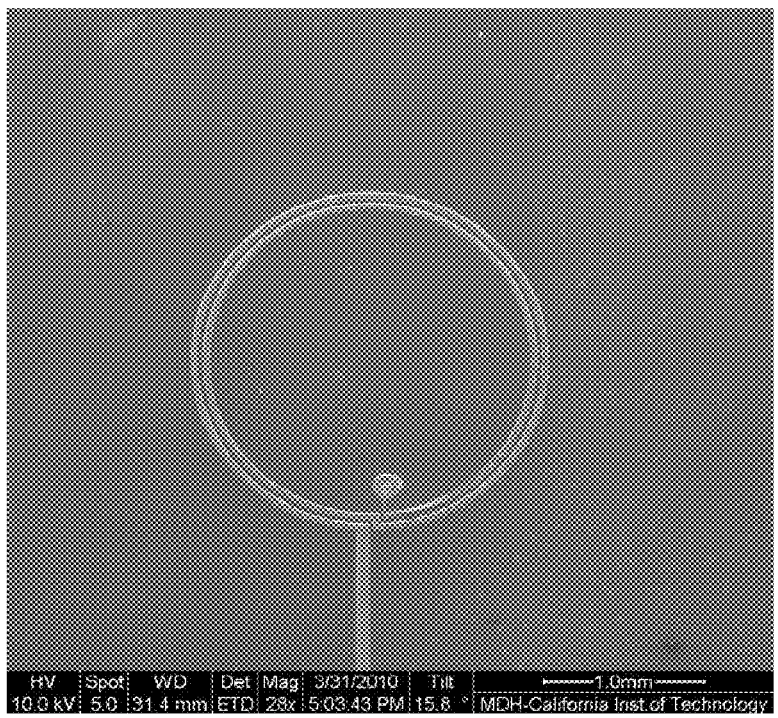
FIG. 27 is an SEM image of a silicon planar microcoil with radius of 1000 microns.

FIG. 27 is an SEM image of a silicon planar microcoil with radius of 1000 microns. The center contact shunts the current to the substrate via an ohmic contact.

To confirm the fabrication work, the microcoils were first electrically tested under DC conditions. The first test used an Agilent Semiconductor Parameter Analyzer 4155 to sweep biasing voltage negative to positive while measuring the current. Although this is a two probe measurement and has the problem of introducing series resistance in the measurement from the leads, it allows for the verification that the copper silicon contacts are indeed ohmic rather than a Schottky rectifying diode. This measurement does not provide an accurate measurement of contact or coil resistance. Current compliance was implemented in the measurement, so once this current is met any increase in voltage will not increase the current further. This is seen in the graphs as a diagonal line. The spike at zero is due to a numerical divide by zero calculation and a short circuit measurement of approximately 3.98 ohms was made. The most important aspect of this measurement is that the copper-silicon junction is ohmic to under 0.1 Ohms Since a 50 MHz AC signal is used for the NMR experiments, any rectification of the signal will introduce errors in the detection.

Figure 28:
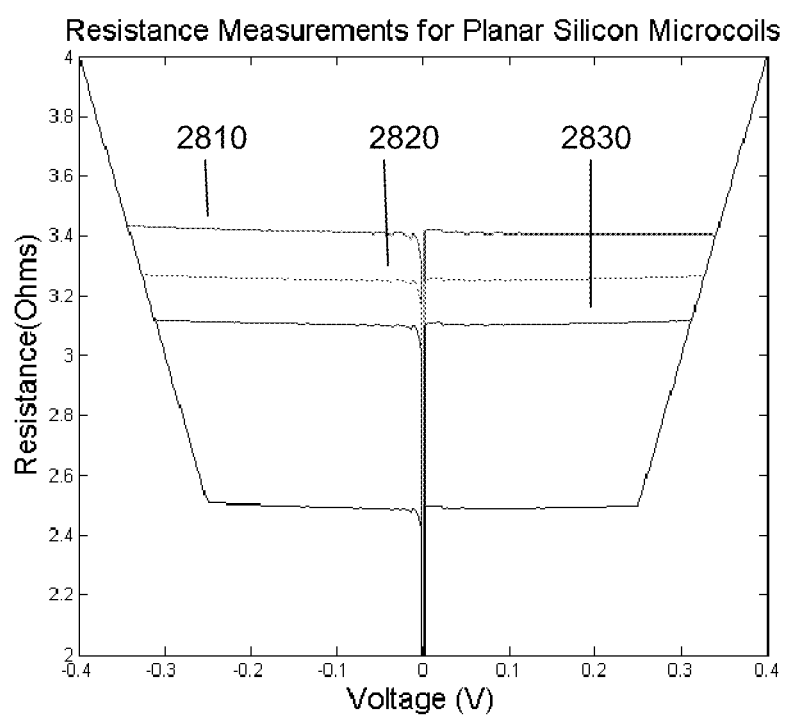
FIG. 28 is a graph of resistance of a 2 probe measurement of planar microcoils taken using an Agilent Semiconductor Parameter Analyzer.

FIG. 28 is a graph of resistance of a 2 probe measurement of planar microcoils taken using an Agilent Semiconductor Parameter Analyzer. Measured lead resistance was 1.9 ohms (from probe tip to probe tip). The diagonal line is when the machine enters current compliance and will not permit the current to increase. The flat resistance denotes that the copper silicon contact is ohmic to under 50 mΩ.

To more accurately measure the DC resistance, a 4 point probe measurement was made using a Keithley 2400 sourcemeter. This type of measurement, also referred to as a Kelvin measurement, injects current into the device while using two other probes to measure the voltage across different components. Since the voltage measurement draws little to zero current, probing the device yields a more accurate measurement. The devices tested had an approximately 7 micron thick copper layer, half as thick as the calculations. The measured results are displayed in the following table with simulated results under DC conditions for a 15 micron thick layer. Comparison between the two resistances shows very good agreement upon application of a multiplier of 2 due to the thickness difference.

| Microcoil Radius (μm) | Measured Coil and Lead Resistance (Ω)~7 micron thick copper | Simulated Coil and Lead Resistance (Ω) - 15 micron thick copper |
|---|---|---|
| 1000/2 turn | 0.716 | 0.375 |
| 750/2 turn | 0.624 | 0.284 |
| 500/2 turn | 0.326 | 0.194 |

To ensure the magnetic field generated was close to those predicted by simulations, a Hall probe and LakeShore 455 Gauss meter was used to measure the Bz field at the center of coil along the axis. Using the Keithley 2400 multimeter to supply 1 amp to the coils, the magnetic field was measured using the Hall probe on a 3 stage micrometer. First the center of the coil was determined in the 'x' and 'y' directions by finding the maxima. The Hall probe was then moved as close to the substrate as possible, the current turned off and the Gauss meter zeroed. This measurement was also normal to the Earth's 50 μT magnetic field which eliminated this variable from the measurement. The current was then turned back on, and the probe lifted in 50 micron increments. This measurement permits the complicated magnetic field measurement to be simplified.

$$B_z(z) = \frac{n\mu I}{2} * \left(\frac{R^2}{(R^2 + (Z+Z_o)^2)^{\frac{3}{2}}}\right)$$

Here, n is the number of turns on the coil, I is the current (1 Amp), μ is the permeability, R is the radius of the coil, and Z and Zo the height above the coil and the offset from zero, respectively.

The collected data was then curve-fit using MATLAB® using the radius and Zo as parameters to be fitted to the above equation. The offset is expected since the Hall probe device is embedded in the probe which is approximately 1 mm thick. A further addition to the offset is if the probe (approximately 6 inches long) is not exactly parallel with the substrate. By curve fitting the data with the offset, the maximum field strength and field profile can be determined for comparison with simulations. All of the curve fits resulted in R-squared values better than 0.95; the extra small coil was not able to generate a curve fit better than 0.85 and was not used. An interesting result was that the multiple turn coils had radius curve fit parameter best fit to a radius value exactly between the two turns. The collected data which indicates the field flattens is actually when the probe makes contact to the substrate.

Figure 29:
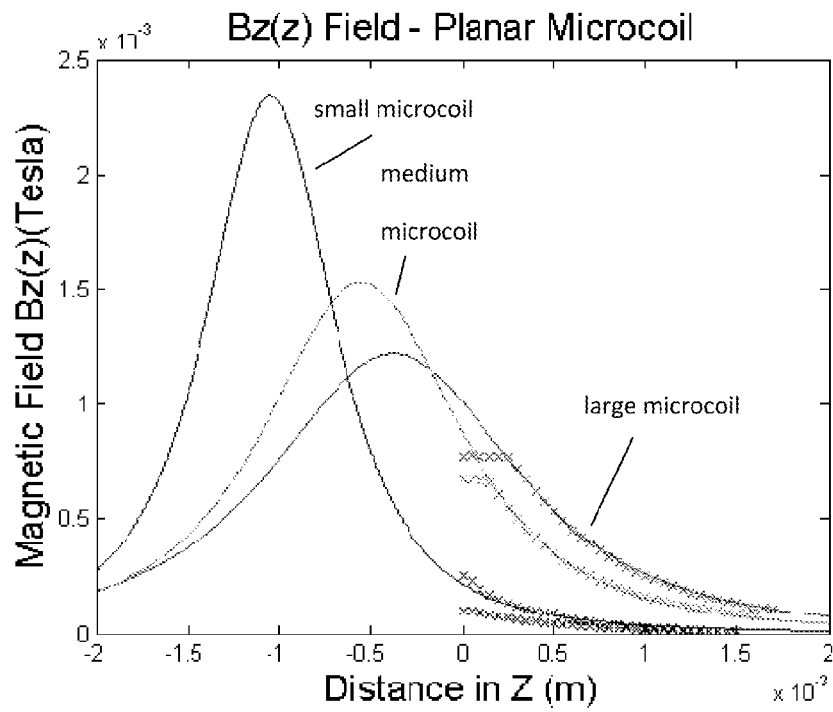
FIG. 29 is a graph of the magnetic field measurements along the z-axis for the microcoils using a Hall probe and Gauss meter.

FIG. 29 is a graph of the magnetic field measurements along the z-axis for the microcoils using a Hall probe and Gauss meter. The data, 'x', was curve fit using the radius and an offset from z=0 as the fit parameters to R-square values better than 0.95. The voltage required for driving the coils at 1 Amp were 2.57, 2.11, 2.42, and 1.64 volts for the large, medium, small, and extra small coils respectively.

Figure 30:
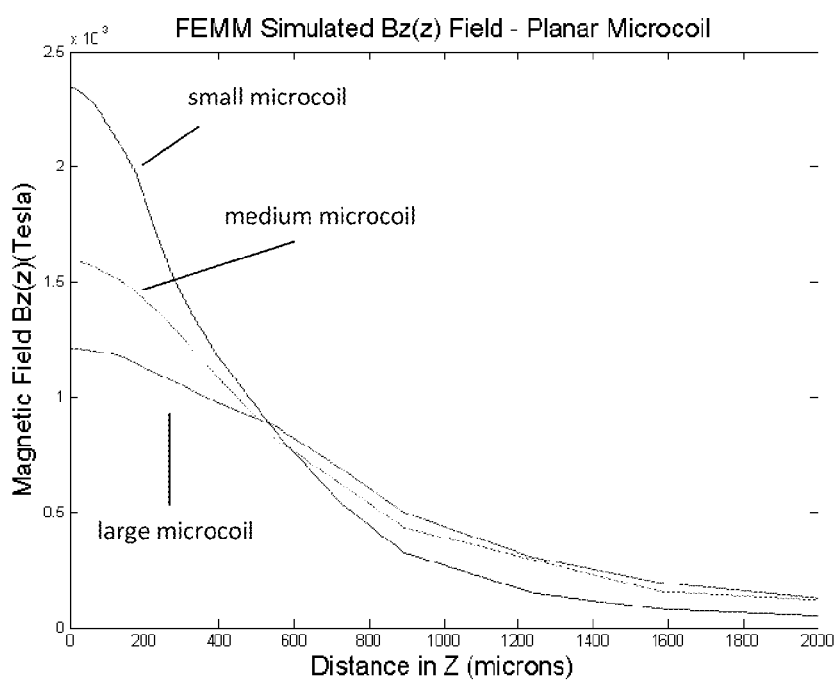
FIG. 30 is a graph of the magnetic field simulations in FEMM along the z-axis for the microcoils.

FIG. 30 is a graph of the magnetic field simulations in FEMM along the z-axis for the microcoils. This simulation was for a DC current of 1 Amp and shows very good agreement with measurements.

Although the DC measurements assist in confirming that the planar microcoil operates as design, the microcoil was intended for use as a 50 MHz NMR detector. For this purpose, it was seen that the bandwidth of the microcoil needed to be as narrow as possible to reduce the detected noise. Desiring a narrow bandwidth is synonymous with asking for a high 'Q'. For this microcoil, the ideal 'Q' is the same for an ideal inductor.

$$Q = \frac{\omega}{\Delta\omega} = \frac{\omega L}{R}$$

| Microcoil Radius (μm) | Simulated Resistance at 50 MHz (Ω) | Simulated Inductance at 50 MHz (H) | Simulated 'Q' at 50 MHz |
|---|---|---|---|
| 1000/2 turn | 1.476 | 15.84 * $10^{-9}$ | 3.4 |
| 750/2 turn | 0.9803 | 11.74 * $10^{-9}$ | 3.8 |
| 500/2 turn | 0.5258 | 7.50 * $10^{-9}$ | 4.5 |

These 'Q' values are significantly lower than handwound coils where more typical 'Q's are in the range of 30. The values are also much lower than current published work on planar microcoils for NMR. Massin et al. demonstrated 'Q's of 17-19 for similar shaped microcoils fabricated on glass slides but operated at 300 MHz (approximately 6 times the frequency we are using). It should be noted that their fabrication sequence required the use of a bridging contact. Taking the frequency into account, these coils should have a comparable 'Q'. It was hypothesized the low 'Q's in designed microcoils might be due to the highly resistive silicon substrate used. To test this, simulations were performed at 46 MHz using the 1000 micron radius coil (the large coil). The substrate resistivity was then adjusted to the following values and simulated: 5 mΩ-cm, 10 Ω-cm, and 1000 Ω-cm. The simulated 'Q's were noted to increase rapidly from 3.46, 11.58, and 11.60 respectively. Unfortunately, the ohmic center contact relied on the highly doped silicon. 10 Ω-cm has an approximate doping of $10^{15}$ for a depletion width of 980 nm, and 1000 Ω-cm has an approximate doping of $10^{13}$ for a depletion width of 9.8 microns. These barrier widths would not permit the bridgeless ohmic tunnel contact. The 'engineering trade-off' made then is the fabrication simplicity for a reduced 'Q'. One might argue that the copper runs should be made thicker in order to reduce the resistance. Unfortunately, the skin depth of 9.4 microns offers only diminishing returns after about 10 microns. One potential procedure to improve Q is to use a thick epitaxial P+ deposited on a 10 Ω-cm substrate. When the ohmic contact is made it would be using P+ silicon but the losses due to the substrate can be dramatically reduced.

For narrow bandwidth operation, a discrete component circuit was designed, simulated, and tested. Since each coil run is insulated from the substrate by a thin oxide layer, a parasitic capacitance needs to be accounted for. To do this the areal foot print is broken into two parts, the area under the coil and the area under the contact pad. The thickness of the oxide layer defines the dielectric thickness. Since thermal evaporation has very poor step coverage, it is assumed that the sidewalls contribute negligible capacitance. Then using the simulated inductance and resistance, the parasitic devices can be accounted for. An approximation of 0.5 Ω for the ohmic contact resistance is used.

used in parallel with a 85 pF Tantalum capacitors to act as the tunable parallel capacitor. For the series capacitor, two of the 0-120 capacitors were used.

Figure 31:
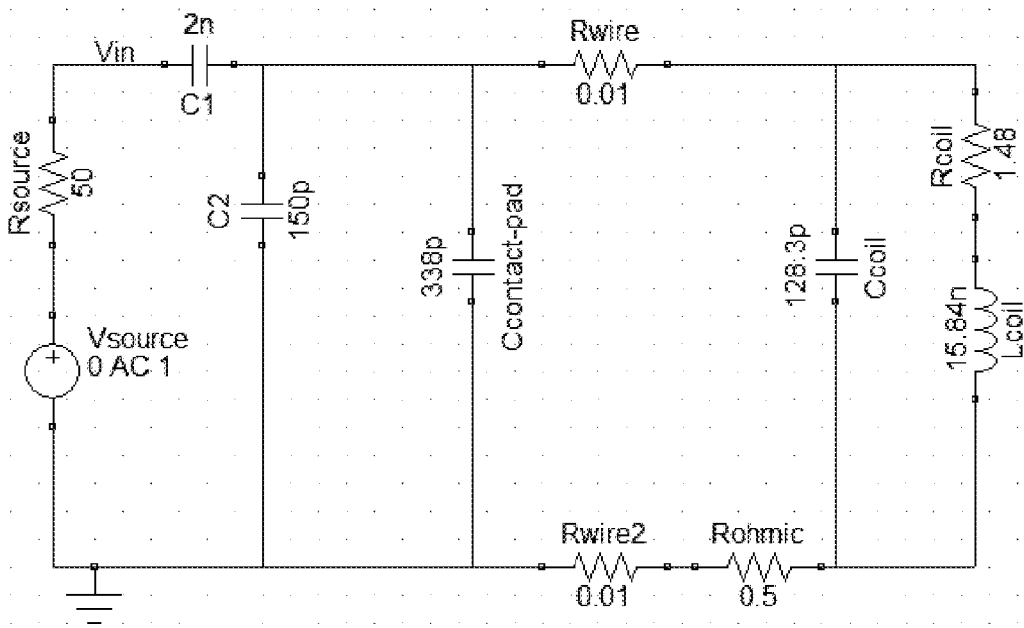
FIG. 31 is a diagram illustrating the Top Spice schematic of the large planar microcoil.

FIG. 31 is a diagram illustrating the Top Spice schematic of the large planar microcoil. This model includes the parasitic capacitances of the coil and contact pad, the coil, lead wires, and ohmic contact resistances, and adds matching capacitors C1 and C2 (used to tune the circuit's resonance).

Figure 32B:
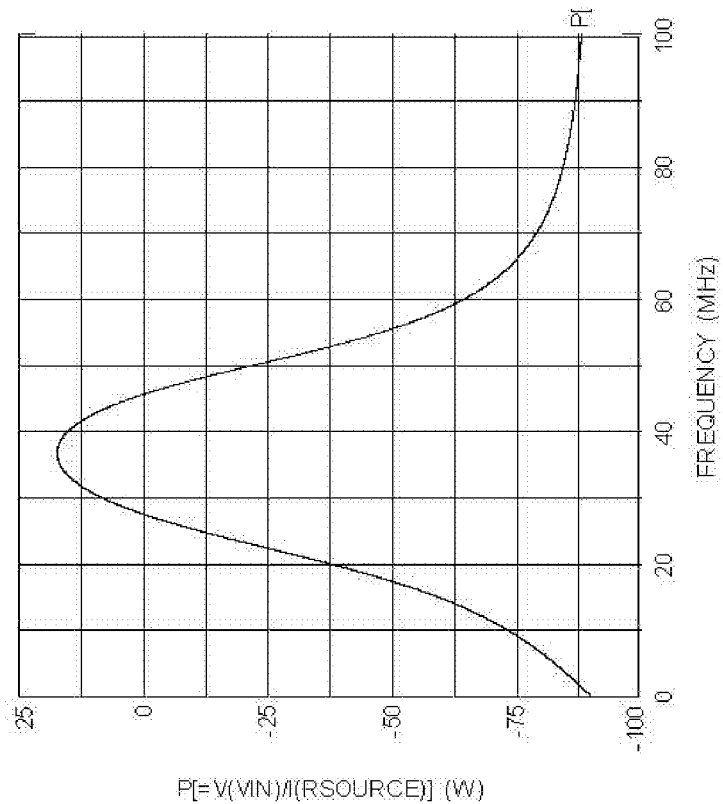
FIG. 32A and FIG. 32B are diagrams illustrating the Top Spice simulation of the large planar microcoil.
Figure 32A:
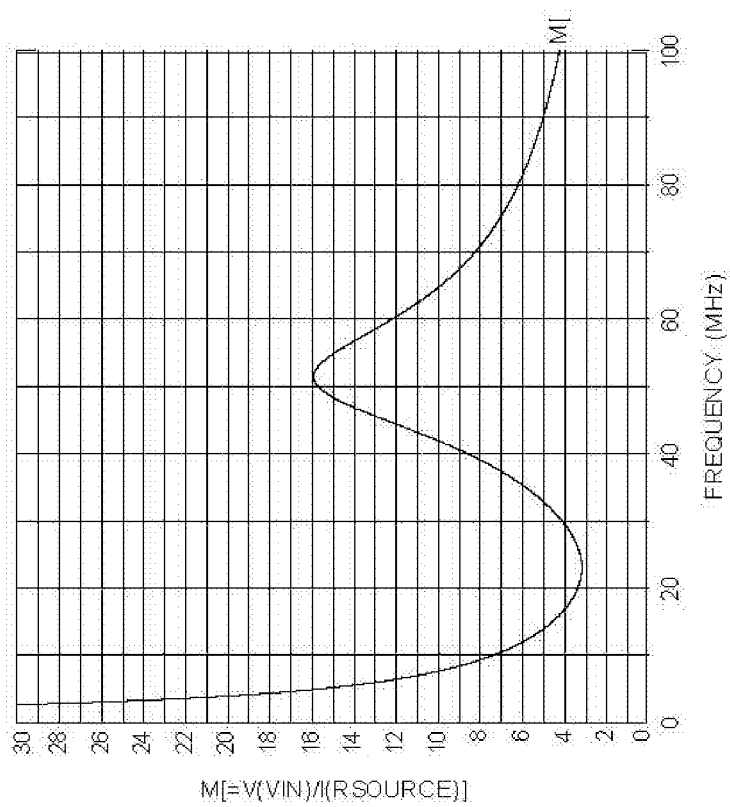

FIG. 32A and FIG. 32B are diagrams illustrating the Top Spice simulation of the large planar microcoil. This model includes the parasitic capacitances of the coil and contact pad, the coil, lead wires, and ohmic contact resistances, and adds matching capacitors C1 and C2 (used to tune the circuit's resonance).

The frequency measurements were performed on an Agilent 8712 ET Network Analyzer with frequency sweeps generally from 0.3 to 100 MHz. Refined sweeps were used for more accurate measurements. With a 50 ohm coax cable, the machine was normalized (effectively zeroing out the reading) after a self calibration. Whenever the frequency range or type of measurement was changed, this normalization procedure was performed. As an external check, a 50 ohm termination

| Microcoil Radius (microns) | Coil Area ($10^{-9}$ m$^2$) | Coil Capacitance 140 nm oxide | Pad Area ($10^{-6}$ m$^2$) | Pad Capacitance 140 nm oxide | Simulated Inductance (nH) | Simulated Resistance (Ω) |
|---|---|---|---|---|---|---|
| 1000/2 turns | 520.25 | 1.28318E−10 | 1.372 | 3.384E−10 | 15.84 | 1.48 |
| 750/2 turns | 394.58 | 9.7322E−11 | 2.441 | 6.02066E−10 | 11.74 | 0.98 |
| 500/2 turns | 268.92 | 6.63283E−11 | 4.617 | 1.13877E−09 | 7.5 | 0.53 |

Careful account of the amount of capacitance the pad area and the oxide thickness contribute permits the planar microcoils to attain a 'natural' resonant frequency. Therefore, the silicon planar microcoils are designed to have an integrated resonant frequency. The naïve calculation using only the capacitance and inductance yields the following frequencies.

| Microcoil Radius (microns) | Coil Resonance (MHz) |
|---|---|
| 1000/2 turns | 58.54 |
| 750/2 turns | 55.54 |
| 500/2 turns | 52.94 |

Although having the circuit tuned automatically based on geometrical and fabrication controls is useful for a theoretical circuit, inevitably experimental variations in a microfab setting introduce variations to device parameters. To account for the experimental variations, two trimmer capacitors are utilized in configurations similar to that of ICP power matching circuit. This circuit was simulated using Top Spice (a graphical circuit simulator) using the solved for C1 and C2 nominal values. It was found that approximately 150 pF was needed to tune the coil down to 50 MHz region (the parallel capacitor) and several nano Farads were need to match the phase (the series capacitor). This circuit was implemented on a PCB board with surface mounted capacitors. The silicon microcoil was placed flat on the board with the backside making contact to copper PCB runs. The silicon was held in place using a modified copper alligator clip, which was trimmed to the width of the contact pad and was used to make electrical contact to the planar microcoil. Two non-ferromagnetic tunable capacitors which ranged in value from 0-120 pF were plug was used to verify accuracy. The first measurement was to measure the 'Q' of the circuit holder; at 50 MHz and tuned with the capacitors the 'Q' was approximately 262.

Figure 33:
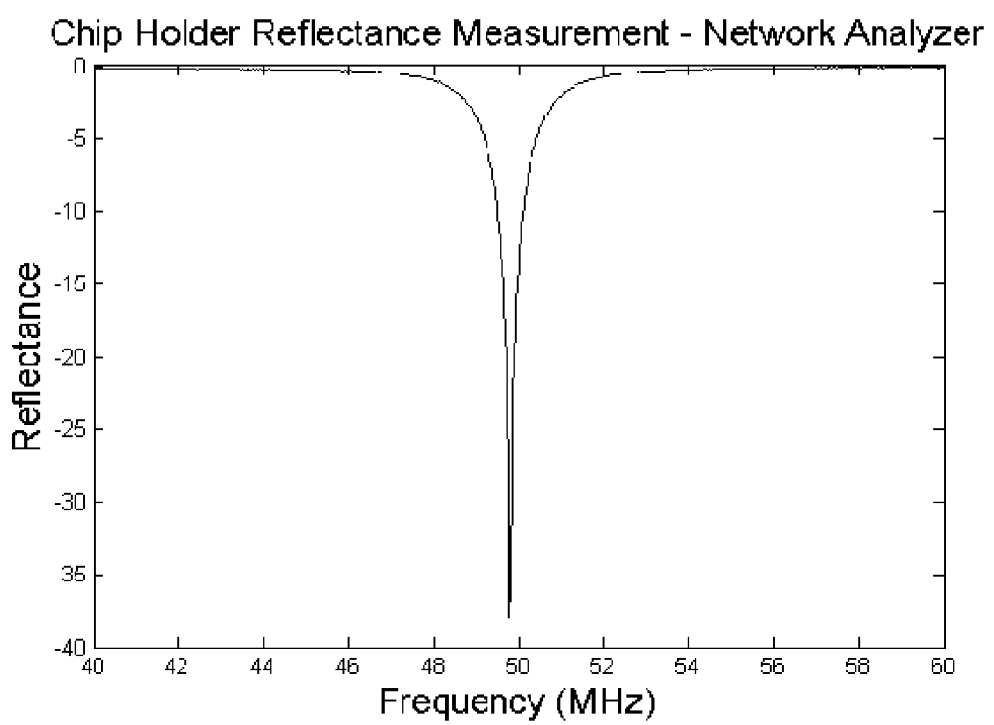
FIG. 33 is a graph showing the result of a reflectance vs. frequency measurement of the microcoil chip holder using a Network Analyzer.

FIG. 33 is a graph showing the result of a reflectance vs. frequency measurement of the microcoil chip holder using a Network Analyzer. The measured 'Q' is approximately 262, with the y-axis in dB.

Figure 34:
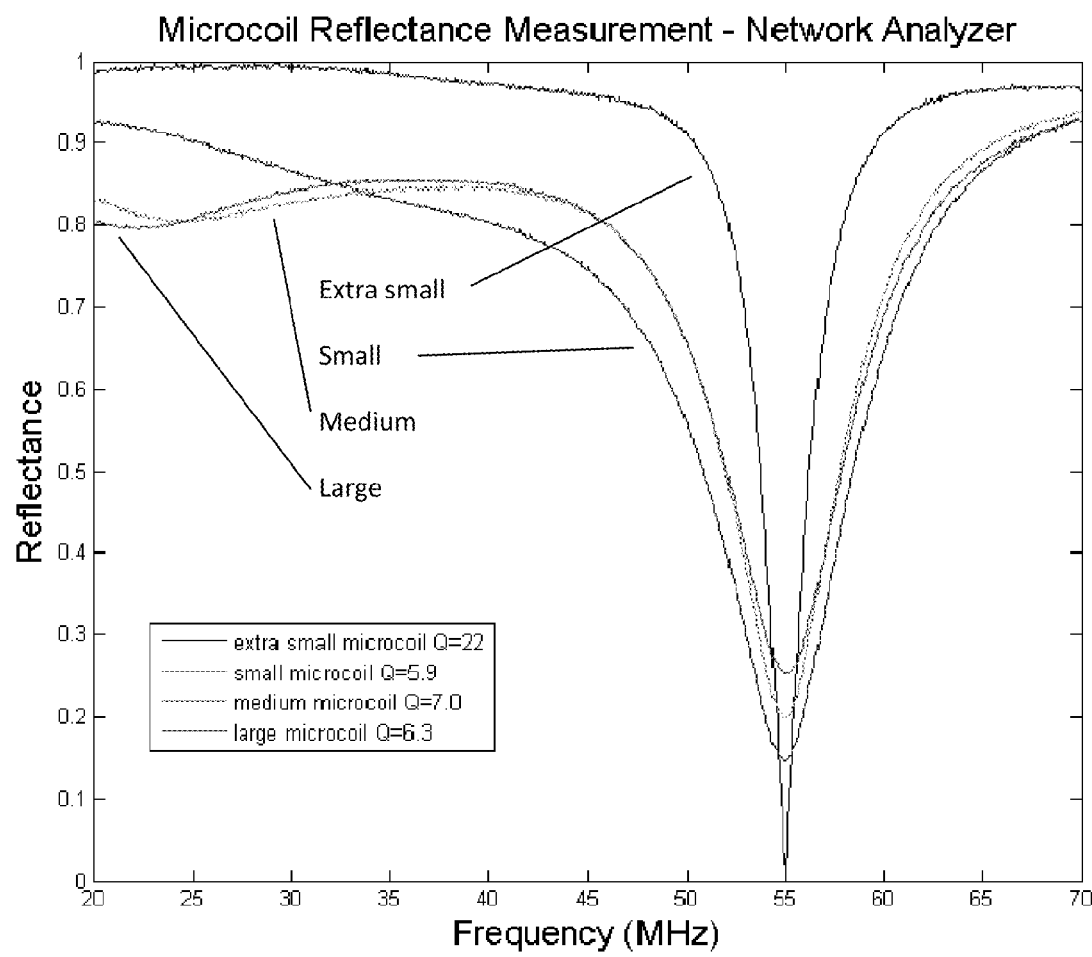
FIG. 34 is a graph showing the result of a reflectance vs. frequency measurements for four silicon planar microcoils.

FIG. 34 is a graph showing the result of a reflectance vs. frequency measurements for four silicon planar microcoils. The measured 'Q's are approximately 22, 5.9, 7.0, and 6.3 for the extra small, small, medium, and large coils.

The microcoils were measured using same technique. For this particular set of microcoils, 20 mΩ-cm resistivity P+ silicon was used. As noted earlier, less conductive silicon resulted in higher 'Q' values. A typical measurement of microcoils fabricated on 5 mΩ-cm resistivity P+ silicon yielded 'Q' values of 7.4, 3, 1.5, and 1.3 for the extra small, small, medium and large microcoils, respectively. The increase in resistivity yielded significantly better 'Q's, 22, 5.9, 7.0, and 6.3 respectively.

With the coils tuned to the correct frequency, they were placed in the magnetic field, NMR pulse sequences were applied and the detected signal was analyzed. By measuring the decay rate of a known signal,(e.g., NMR of water), the decoherence rate can be measured. This decoherence rate can be shown to be a combination of the natural decay rate plus the inhomogeneity of the magnetic field. For an apparatus such as the one built here, a good approximation is that the inhomogeneity of the field dominates.

$$1/T_2^* = 1/T_2 + \gamma \cdot \Delta B_o$$

Here $T_2^*$ describes the total decoherence time, $T_2$ describes the natural decoherence time, $\gamma$ is the gyromagnetic ratio, and $\Delta B_o$ is the magnetic field inhomogeneity. For the unshimmed magnetic field described earlier and assuming a natural decoherence time of a few hundred milli-seconds, the field would need to be shimmed to better than 1 ppm to see the natural decoherence times. For this reason, it is typical to measure the shimming of the magnetic fields using these coils while simultaneously backing out information on the exact SNR.

We now turn to a description of the fabrication procedures used to construct the NMR coil systems described herein.

Resist Patterning

Photoresist—Clarion AZ 5214E

This procedure patterns a silicon wafer (1 to 4 inches) with a 1.6 micron thick layer of patterned photoresist. The prebake and exposure steps are significantly longer than suggested by the manufacturer, but have proven to be invariant against small perturbations seen frequently in microfabrication facilities. Optional steps are denoted with an asterisk. The steps of the procedure are:

1. *Clean wafer with Acetone, Isopropyl Alcohol, Methanol, DI water.
2. *Dehydration bake on a hotplate at 120 C for 3 minutes.
3. Spin AZ 5214e at 6000 rpm, Acl speed of 9, for 1 minute.
4. Prebake on a hotplate at 95 C for a minimum of 3 minutes.
5. Lithographically expose for 52 seconds under hard mask with a 350 Hg line at 275 Watts.

At this point, the resist can be developed for use as a positive resist. If a negative resist is needed, then the following reversal steps can be made.

6. Reversal bake on a hotplate at 120 C for exactly 1 minute. This step is critical and excessive deviations will result in pattern transfer.
7. Flood expose for 52 seconds under hard mask with a 350 Hg line at 275 Watts.

Both the normal and reversed pattern procedures continue on at this point.

8. Develop in MF 322 for 20 seconds (normal) or 25 seconds (reversal).
9. *Reflow the resist if necessary on a hotplate at 160 C for a few seconds.

Electron Beam Resist—PMMA 950 A2

This procedure patterns a silicon wafer with approximately 50 nm of electron beam resist. The exposure is conducted using an electron beam writer in the KNI at Caltech.

1. *Clean wafer with Acetone, Isopropyl Alcohol, Methanol, DI water.
2. *Dehydration bake on a hotplate at 120 C for 3 minutes.
3. Spin PMMA A2 at 2500 rpm for 1 minute.
4. Prebake on a hotplate at 180 C for a minimum of 5 minutes.
5. Beam expose using a approximately a 7nA. Typical write speeds are 34 MHz and doses are 900 to 100 micro-micro coulombs.
6. Develop in a 3:1 mixture of Methly-Isobutyl-Ketone (MKIB) and Isopropyl Alcohol.

Silicon Cleans

RCA-1 and BHF Clean Cycle

This clean cycle was routinely used to ensure both removal of the alumina etch mask, polymer from pseudo Bosch etching, and to ensure that the surface states were hydrogen passivated and ready for metallization. By performing this clean cycle, contacting to P silicon using both copper and gold yielded ohmic contacts repeatably.

1. Heat 15 mL of NH4OH to 90 C on a hotplate (temperature stabilization is not critical since addition of other chemicals will result in exothermic reactions).
2. Add 5 mL of H2O2 to the heated solution. Bubbles should begin to appear (similar to 7-up soda).
3. Place silicon sample in solution for 3 minutes.
4. Remove silicon sample and rinse in DI.
5. Place silicon sample in BHF for 1 minute.
6. Remove silicon sample and rinse in DI.
7. Repeat steps 3-6 three times. Upon completion of final step, N2 dry the sample. Sample should be evaporated or placed into an N2 environment as quickly as possible.

Etch and Deposition Procedures Cryogenic Silicon Etch

This etch procedure allows for a silicon etch that provides a silicon etch rate of Eo=1.14 microns per minute and an aspect ratio coefficient of b=0.04099.

This etch was verified in 3 different Oxford Plasmalab 100s ICPRIE 380 instruments. It is recommended that Fomblin oil be used for adhesion of silicon pieces to a carrier wafer. Fomblin oil can be removed using Isopropyl Alcohol or an oxygen plasma.

| $SF_6$ | 70 sccm | ICP Power | 900 W |
| $O_2$ | 5 sccm | Fwd Power | 5 W |
| Temperature | −120 C. | Pressure | 10 mt |

Pseudo Bosch Silicon Etch

This etch procedure allows for a silicon etch that provides a silicon etch rate of approximately 175 nm per minute. This etch was verified in 2 different Oxford Plasmalab 100s ICP-RIE 380 instruments. It is recommended that Fomblin oil be used for adhesion of silicon pieces to a carrier wafer. Fomblin oil can be removed using Isopropyl Alcohol or an oxygen plasma. This etch creates silicon nanopillars using alumina as an etch mask. If this etch is used with a Gallium implanted etch mask, a modification to the etch is needed. This modification is C4F8 tuned down to 50 sccm and Fwd power tuned down to 10 W.

| $SF_6$ | 33 sccm | ICP Power | 1200 W |
| $C_4F_8$ | 57 sccm | Fwd Power | 20 W |
| Temperature | 15 C. | Pressure | 10 mt |

Silicon Dioxide Etch

This etch procedure allows for a silicon dioxide etch that provides a silicon etch rate of approximately 600 nm per minute. This etch was verified in 2 different Oxford Plasmalab 100s ICPRIE 380 instruments. It is recommended that Fomblin oil be used for adhesion of silicon pieces to a carrier wafer. Fomblin oil can be removed using Isopropyl Alcohol or an oxygen plasma. Selectivity using a chrome mask on a quartz wafer is 33:1.

| $O_2$ | 2 sccm | ICP Power | 2100 W |
| $C_4F_8$ | 45 sccm | Fwd Power | 200 W |
| Temperature | 20 C. | Pressure | 7 mt |

Bosch Silicon Etch

This etch procedure allows for a silicon etch that provides a silicon etch rate of approximately 900 nm per cycle (3.6 microns per minute). This etch was used in an Oxford Plasmalab 100s ICPRIE 380s modified with the mass flow controllers situated on top of the etcher. It is recommended that Fomblin oil be used for adhesion of silicon pieces to a carrier wafer. Fomblin oil can be removed using Isopropyl Alcohol or an oxygen plasma. Etch time was 15 seconds and deposition time is 10 seconds.

| $SF_6$ | 160 sccm | ICP Power | 1750 W |
| $C_4F_8$ | 0 | Fwd Power | 30 W |

| | | | |
|---|---|---|---|
| Temperature | 15 C. | Pressure | 20 mt |
| SF$_6$ | 0 | ICP Power | 1750 W |
| C$_4$F$_8$ | 140 sccm | Fwd Power | 10 W |
| Temperature | 15 C. | Pressure | 20 mt |

Cryogenic Silicon Etching

The etch is a mixed-mode silicon etch performed with substrate temperatures ranging from −85 C to −140 C. The cooler wafer temperature encourages growth reactions of silicon with oxygen to generate thin passivation layers while simultaneously etching. This section on the cryogenic silicon etch describes the characteristics of the etch, etch rate control, angle control, and the notching effects seen at the top of the etched structures. Finally, techniques are demonstrated for where this etch is most useful and coupled with a discussion of the appropriateness of specific etch masks.

General Characteristics of Cryogenic Etching

The cryogenic silicon etch is a passivated etch utilizing SF$_6$ as the etch gas and O$_2$ as a catalyst for the passivation and was first demonstrated by Tachi et al. The SF$_6$ is ionized in the plasma to create a mixture of SF$_x$ and F species; where x denotes a number between 1 and 5. The most useful ion from this splitting is the fluorine ion. When the F ion reaches the substrate, the F can remove a Si atom. When the ions chemically recombine with the silicon a volatile gas is created, SiF$_4$, and the etch product is pumped from the chamber. What is unique about this etch is that a passivation layer can be created with O ions and the partially etch product SiFx. By lowering the temperature below −85 C, recombination of Si, O, and F becomes energetically favorable and a thin SiO$_x$F$_y$ layer is created. As one or two F atoms diffuse into the Si lattice, O atoms can arrive and bond, as described by Mellhaoui et al. This thin film acts as a thin protection layer from milling ions such as SF$_5$. If the flux of milling ions is low, for example on the sidewall of the etched structure, then the passivation can reduce the chemical etching and improve the anisotropic nature of the etch. The passivation can be created by other means, such as ionization of the etch gas SiF$_4$. It has been demonstrated that injection of SiF$_4$ and O$_2$ can actively passivate during the etch. Chopping-mode etches using this chemistry have also been demonstrated. Upon bringing the wafer back up to room temperature, this passivation layer then becomes volatile and evaporates away.

This passivation scheme becomes very attractive for deep reactive ion etching (DRIE). Using the mixed-mode scheme, the plasma density and chemical etch rate can be significantly increased while protecting the sidewalls of the etched structure. Upon warming the substrate up, the etch mask evaporates. Further, the gases required for the etch are substantially cleaner and less costly than that required for chopping-Bosch etching. Since the etching and passivation are continuous, the sidewalls of the etch are significantly smoother than possible with the chopping-Bosch due to its scalloping etch characteristics. In particular, two influential papers by de Boer and Jensen et al provide a significant amount of discussion on control over the cryogenic etch. To assist the reader with developing intuitions with regards to this etch, a qualitative description of etch control will be discussed here.

It is useful to understand how essential parameters may affect the etching rate and profile of the etched structure. An advantage of using an ICPRIE is the separation of control over the chemical etch rate and milling etch rate. The cryogenic etch is predominately a chemical etch, so controlling the F ion density greatly controls the etch rate. Control mechanisms over the ion density include ICP power, SF$_6$ flow rate into the etcher, and pressure control. Increasing the ICP power essentially ionizes more of the SF$_6$ injected into the chamber. As the ICP power increases, an increase in etch rate is noted with etch rates recorded from 1 to 10 microns per minute. This increase is attributed to the improvement of the ionization efficiency of the gas. In the same manner, increasing the injected gas also increases the amount of ionization. Unlike increasing the ICP power, however, increasing the flow rate of the gas past a critical point for a given ICP power can lead to a decrease in etch rate, possibly due to an increase in scattering of ions. Although increasing pressure does permit a slight increase in etch rate, significant pressure increases without increasing the SF$_6$ flow rate can lead to instabilities in the plasma and difficulty in striking the plasma.

DC bias gives a measure of the amount of milling occurring and that Fwd power generally dominates the DC bias. Evidence for this fact is seen from varying the ICP and Fwd power. From the data displayed, although ICP power is varied over a range 100 times as big as the Fwd power, it only has ⅕th the effect on DC bias. However, the data also clearly shows that the overall etch rate is dominated by the ICP power.

Figure 36:
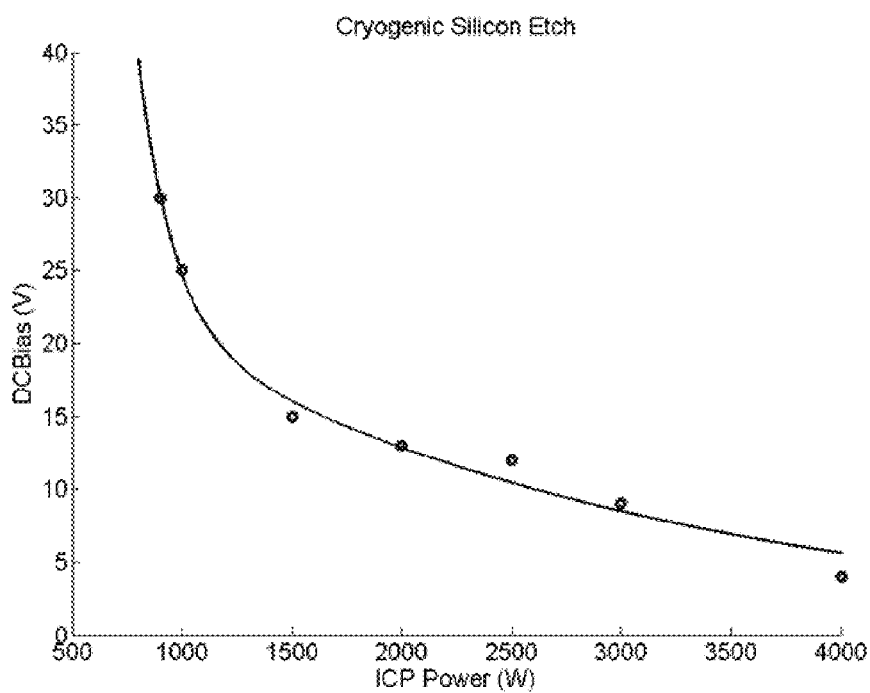
FIG. 36 is a graph that illustrates the changes in DC bias voltage as ICP power is increased for the cryogenic silicon etch.

FIG. 36 is a graph that illustrates the changes in DC bias voltage as ICP power is increased for the cryogenic silicon etch.

Figure 37:
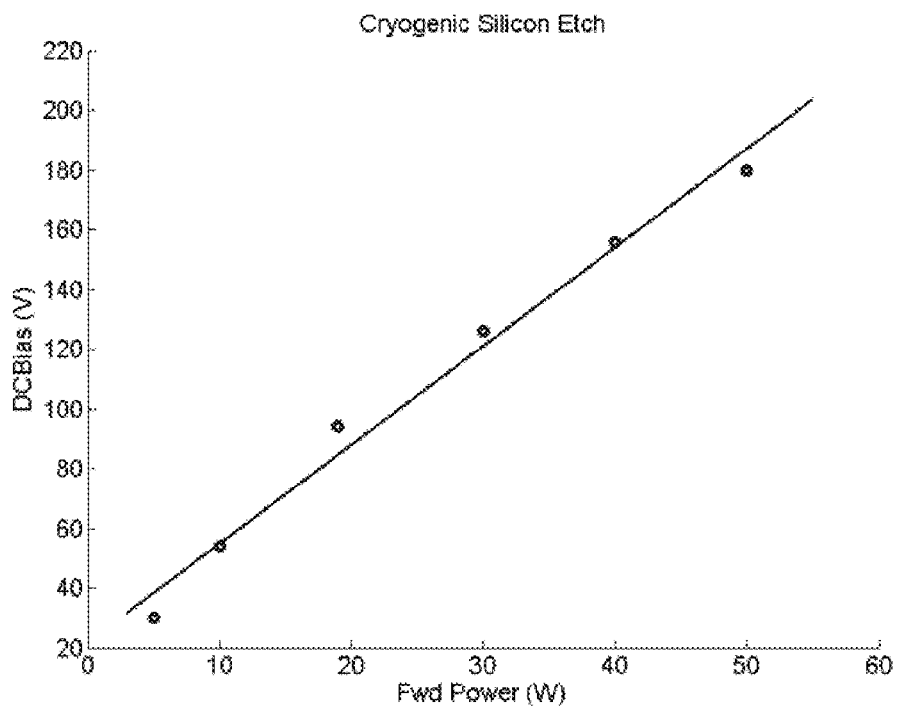
FIG. 37 is a graph that illustrates the changes in DC bias voltage as Fwd power is increased for the cryogenic silicon etch.

FIG. 37 is a graph that illustrates the changes in DC bias voltage as Fwd power is increased for the cryogenic silicon etch.

Increases in the Fwd power, in the range of 0 to 40 W, results in almost immeasurable etch rate changes, although it does offer significant increase in DC bias voltage. Conversely, increasing the ICP power shows relatively little change in DC bias voltage but significant increase in etch rate. Clearly, the cryogenic etch is predominantly more of a chemical etch than a milling etch.

Figure 38:
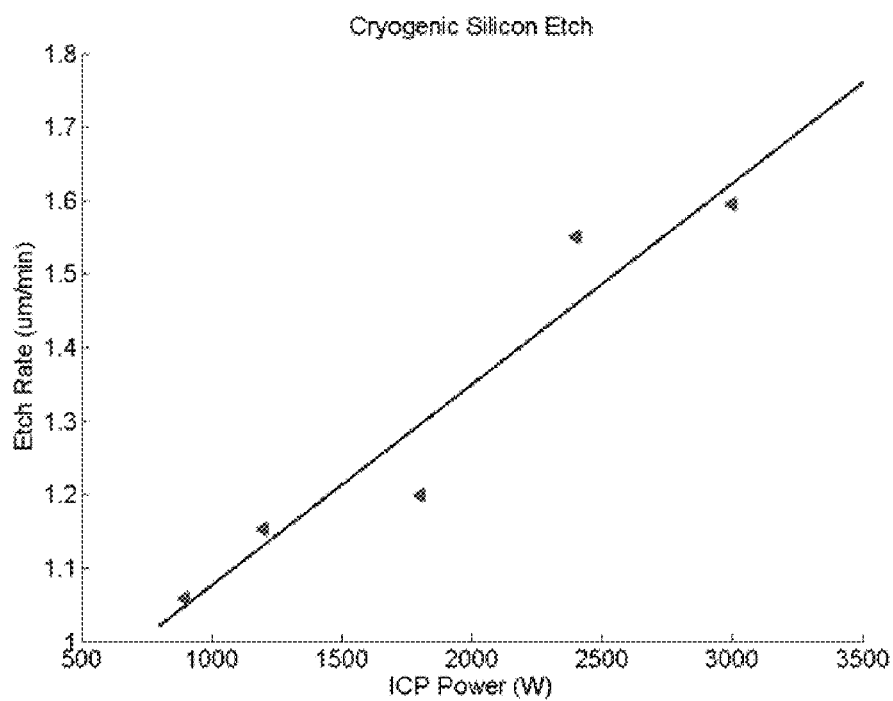
FIG. 38 is a graph that illustrates the changes in etch rates as ICP power is increased for the cryogenic silicon etch.

FIG. 38 is a graph that illustrates the changes in etch rates as ICP power is increased for the cryogenic silicon etch.

Figure 39:
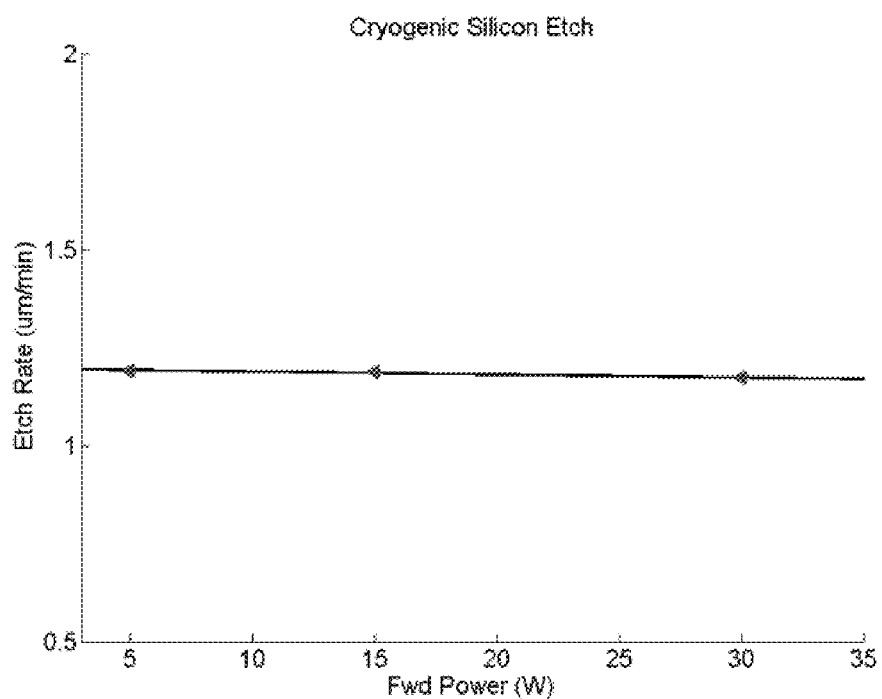
FIG. 39 is a graph that illustrates the changes in etch rates as Fwd power is increased for the cryogenic silicon etch.

FIG. 39 is a graph that illustrates the changes in etch rates as Fwd power is increased for the cryogenic silicon etch.

The starting etch conditions for the measurements made here are as follows:

| | |
|---|---|
| SF$_6$ | 70 sccm |
| O$_2$ | 5 sccm |
| Temperature | −120 C. |
| ICP Power | 900 W |
| Fwd Power | 5 W |
| Pressure | 10 mt |

The cryogenic etch is usually performed under very low DC bias conditions. This demonstrates the significant advantage of low Fwd power etching. If the milling rate is low, then the etch mask can survive for much deeper etches. For this reason, the cryogenic etch has been measured to achieve etch mask selectivity values of 100:1 for photoresist etch masks, 200:1 for silicon dioxide etch masks, and more recently 3000:1 for alumina One finds that lowering the Fwd power generally increases the etch mask selectivity. Some amount of milling is required, however. Injection of O$_2$ into the etcher provided the needed chemistry for passivation. This passivation is highly desired on the sidewalls for protection, but on the horizontal surfaces the passivation layer needs to be milled away for the silicon etching to occur. If the Fwd power is too low for a given O$_2$ flow rate at a given temperature, incomplete removal of the passivation on exposed horizontal silicon surfaces can occur and black silicon can initiate. Black silicon is essentially silicon spikes that occur due to micromasking. Presumably, the name stems from the observation that these spikes appear optically absorbing, flat black. If black silicon begins for a given etch condition, increasing the Fwd power a few watts can remove the effect. There is also an aspect ratio dependence on when black silicon occurs.

Figure 40:
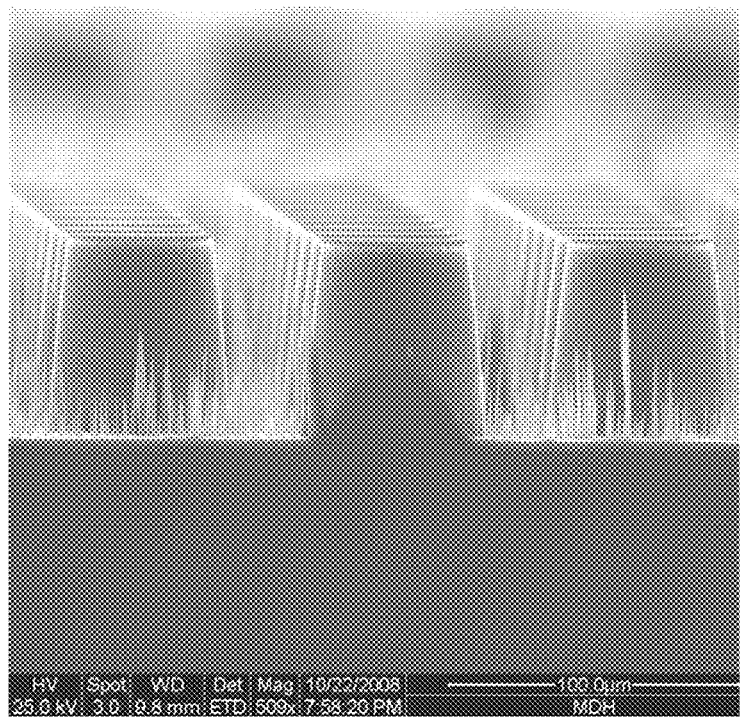
FIG. 40 is an SEM micrograph showing black silicon beginning to form between silicon micropillars.

FIG. 40 is an SEM micrograph showing black silicon beginning to form between silicon micropillars. The oxygen flow rate is too high for the given forward power creating a passivation layer on the horizontal surface.

$SiO_xF_y$ Passivation Control

Passivation control is had using both the temperature and $O_2$ flow. Increasing passivation requires improvement in reaction probability. Several examples are reducing temperature, requiring more O ions to reach the silicon sidewalls, or increasing $O_2$ flow rate. Substrate temperatures are automatically controlled by throttling $LN_2$ to the plate. Typically, lowering the temperature improves the passivation with typical temperatures in the range of −110 C to −140 C. Holding temperature stable can be critical as seen from wavy etch sidewall profiles generated as the plate temperature fluctuates by 10 degrees. This effect was demonstrated by the following etch performed under these conditions:

| | |
|---|---|
| $SF_6$ | 70 sccm |
| $O_2$ | 4 sccm |
| Temperature | −130 C. |
| ICP Power | 900 W |
| Fwd Power | 2 W |
| Pressure | 10 mt |
| Time | 30 min |

During this 30 minute etch, the temperature dropped to −122 C then cooled back to −130 C. Qualitatively, as the etch became warmer less sidewall passivation occurred forcing the etch to become slightly reentrant. As the etch began to slowly cool back to −130 C the etching angle returned to the optimized 90 degrees. The pattern was hexagonally spaced pillars of 20 micron diameters separated by 20 microns. The mask used was AZ 5214e photoresist 1.6 microns thick.

It is advantageous to hold the table temperature as steady as possible. To assist the $LN_2$ regulator on the Oxford machine, the $LN_2$ dewer was pressurized to 35 psi using house nitrogen and regulated. This example is useful in that it clearly shows that temperature controls passivation.

Figure 41:
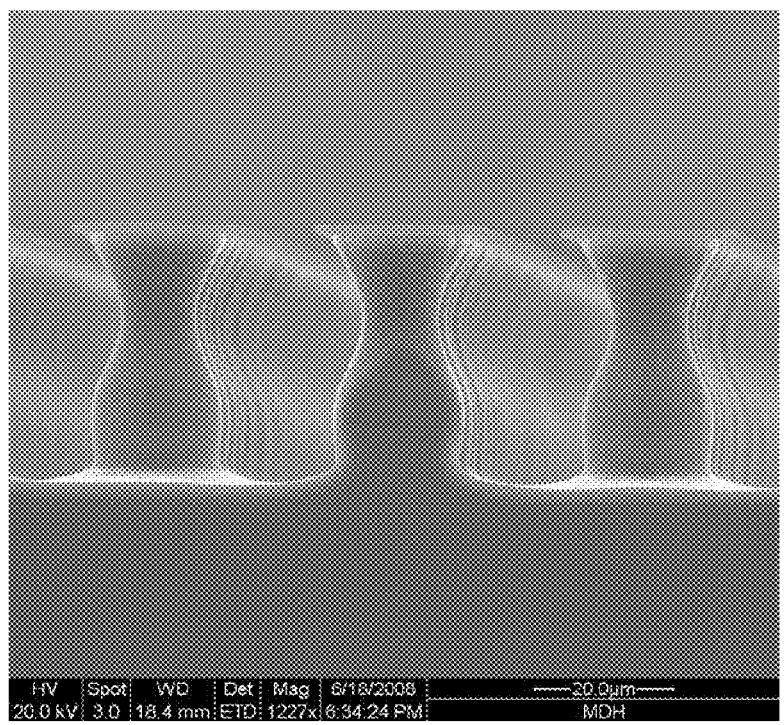
FIG. 41 is an SEM micrograoph that demonstrates the effect substrate temperature has on the angle of the cryogenic etch.

FIG. 41 is an SEM micrograoph that demonstrates the effect substrate temperature has on the angle of the cryogenic etch. The pattern was 20 micron diameter pillars arranged in a hexagonal array. The etch temperature varied from −130 C down to −122 C.

A second method for controlling passivation, and hence etch angle, is the oxygen flow rate. Flow rates of $O_2$ typically range from 2 to 10 sccm and can change the angle of the etch around 10 degrees. The range is based on two extremes, no passivation and the beginning of black silicon. In the first case, too little oxygen implies that the $SiO_xF_y$ layer will not have enough atoms to act as a protective layer. Further, controlling the flow rate in these low flow regimes becomes difficult based upon the size of the oxygen mass flow controller (MFC). The Oxford machines used had 100 sccm oxygen MFCs which implies that flows below 2 sccm were unstable. In the second case, so much $O_2$ is present that, for a given milling rate, small islands of passivation begin to form on the horizontal surfaces. These stochastically located passivation areas then begin to act as masking for the silicon and the black silicon forms. For the −120 C cryogenic etching temperatures, it was experimentally determined that for low aspect ratio trenches the maximum $O_2$ flow rate was 7.5 sccm when Fwd power was set to 5 W.

Controlling $O_2$ provides a useful mechanism for controlling the angle of the silicon etch. To determine the angle, silicon micropillars were etched with different $O_2$ flow rates. The mask used was 1.6 microns of AZ 5214e of photoresist. The pattern utilized was 5 micron circles separated by 5 microns, 10 micron circles separated by 10 microns, 20 micron circles separated by 20 microns and 50 micron circles separated by 50 microns in a hexagonal packed array all on the same substrate. Having multiple diameter pillars on the same substrate permitted aspect ratio dependence to be ascertained. Since the spacing was equal to the pillar diameter, the pattern also permitted the definition of aspect ratio to be defined by both the ratio of the pillars height to the pillars width as well as the etched trench's ratio of height to width; the latter definition is more utilized in the etching community. The etch was performed under the following cryogenic conditions:

| | |
|---|---|
| $SF_6$ | 70 sccm |
| Time | 40 min |
| Temperature | −120 C. |
| ICP Power | 900 W |
| Fwd Power | 5 W |
| Pressure | 10 mt |

The angle, etch depth, and photoresist remaining was measured using a FEI Quanta SEM. By sweeping the $O_2$ from 3.5 to 7.5 sccm, a linear dependence was ascertained for each of the micropillar diameters. The 7.5 sccm data points were removed since black silicon was observed in the trenches. The aspect ratio dependence of the $O_2$ flow rate is evident by the observation that for a given $O_2$ flow rate, the width of the etched trench increases the angle of the etched pillar traverses from positive taper to reentrant.

Figure 42:
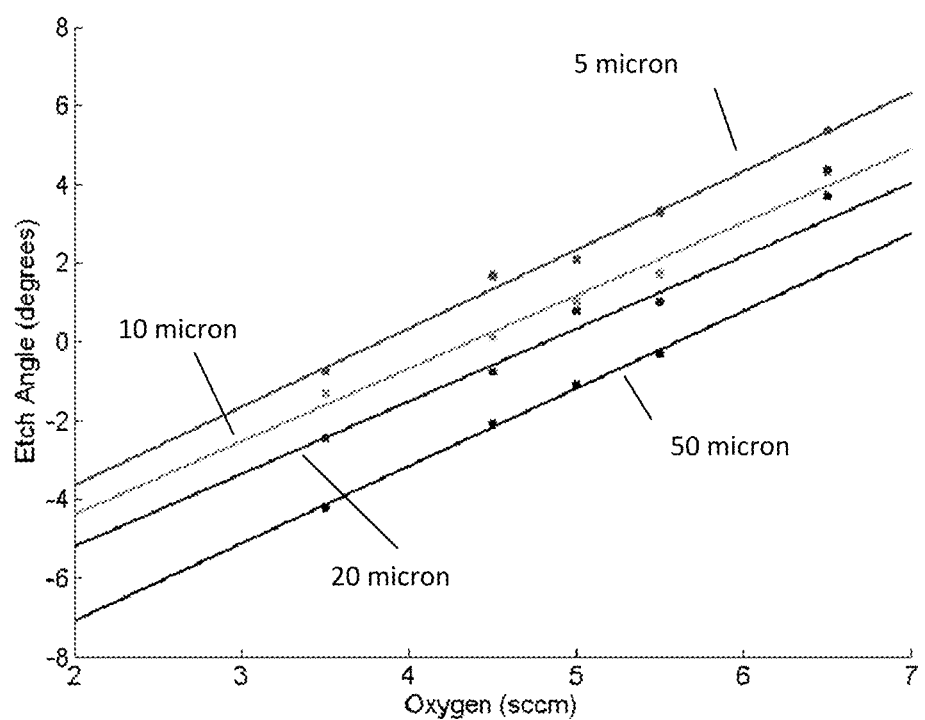
FIG. 42 is a graph that illustrates etch angle control using $O_2$ flow rate for the cryogenic etch for different feature dimensions.

FIG. 42 is a graph that illustrates etch angle control using $O_2$ flow rate for the cryogenic etch for different feature dimensions. A linear correspondence was established for each of the pillar diameters of 5 micron, 10 micron, 20 micron, and 50 micron.

The dependence of etch angle with oxygen flow implies that precision flow rates are required for reproducibility. More generally, any factor which changes the bonding characteristic or probability of bonding, such as preventing the oxygen from reaching the etched sidewalls, will change the angle of the etch. It appears that any minor change can have drastic effects on the etch angle. One such effect could be a dirty chamber in which oxygen is scavenged. For this reason, it is advantageous to begin cryogenic etching with a recently cleaned chamber. A typical cleaning includes the steps of opening the chamber and scrubbing the sidewalls clean, and immediately following with a high pressure $SF_6/O_2$ plasma at room temperature. Once clean, the chamber is then seasoned by running the desired etch procedure on a blank silicon wafer. If a cleaning is not possible, a temporary fix can be achieved by lowering the table temperature.

Figure 43:
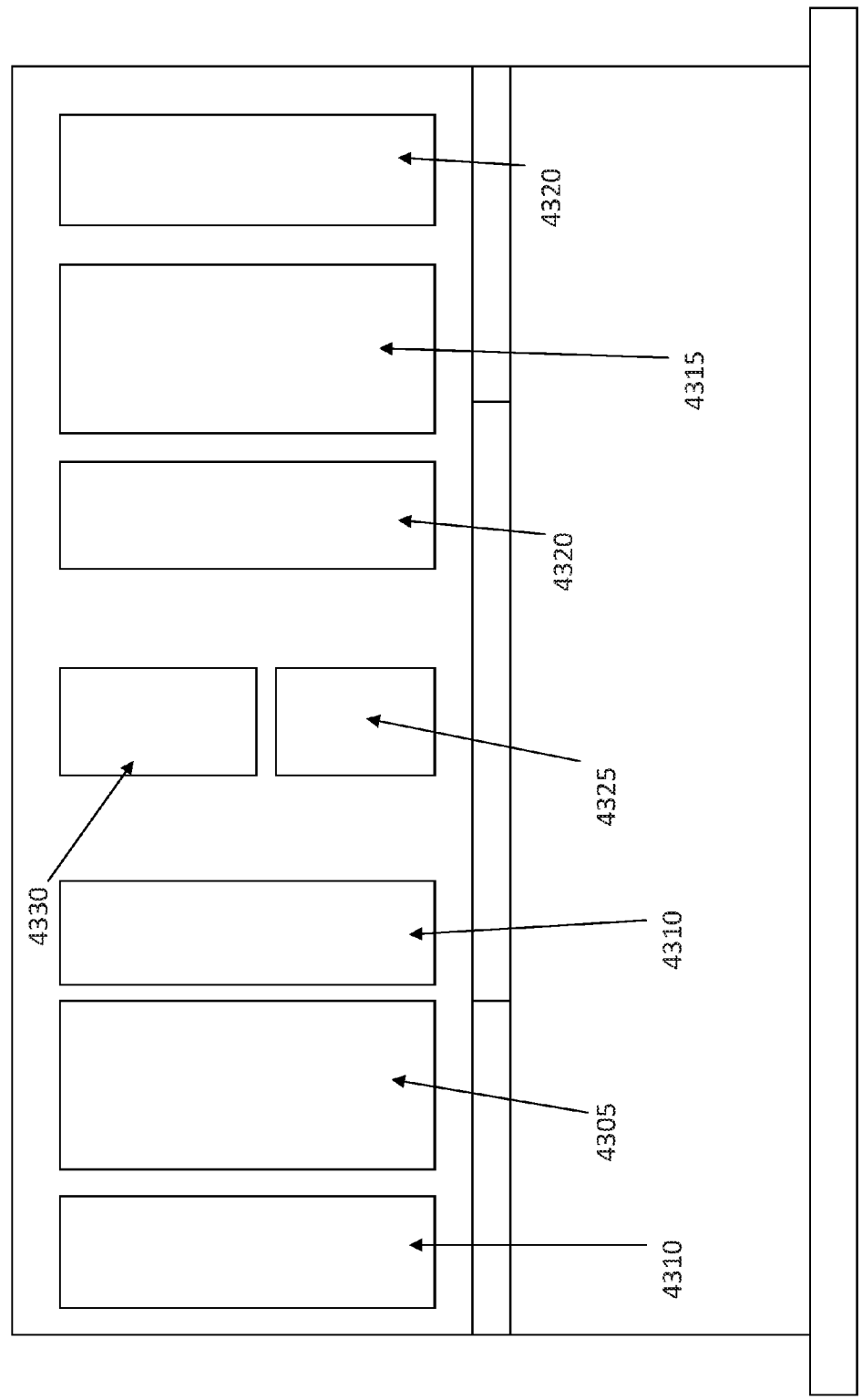
FIG. 43 illustrates an exemplary shimmed magnet configuration.
Figure 44:
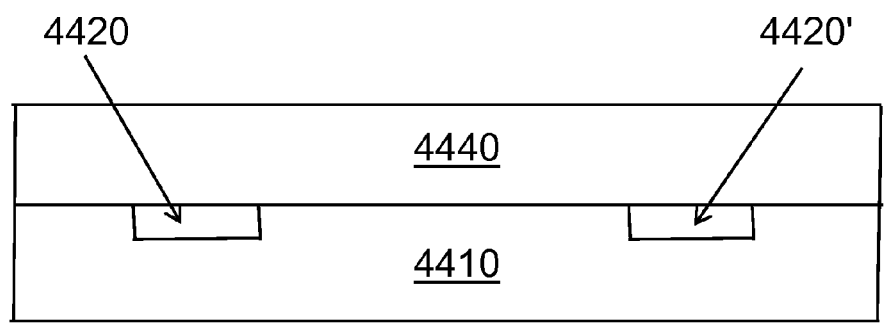
FIG. 44 is a cross sectional diagram that illustrates a circular substrate 4410 having an etched grove 4420, 4420' defined in one face thereof which are filled with a magnetic material and which substrate has an overcoating of a protective layer 4440.

FIG. 43 illustrates an exemplary inte rnal structure of a shimmed magnet configuration, as described for example also in FIG. 5. The illustration of FIG. 43 is intended as a schematic cross section, not an actual visual cross section. In other words, FIG. 43 illustrates several components and how these components are physically located relative to each other, in a generic fashion. For example, the air gap (4325) may be in the center location between the two holders (4310,

4320) or may be lower or higher than the center location. FIG. 43 illustrates several components, comprising a first magnet (4305) between two non magnetic holders (4310), such as for example made of Garolite. A second magnet (4315) is also located between two non magnetic holders (4320). An air gap (4325) is located between the two holders (4310,4320). The air gap allows the introduction of samples within the magnetic field generated by the magnets (4305,4315). A shim (4330) is also located between the two holders (4310,4320).

Definitions

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A magnetic apparatus, comprising:
a support structure configured to support two permanent magnets in defined relative orientation and location, said support structure comprising non-magnetic material, said support structure having an aperture defined therein for placement of a measurement element and a material of interest between said two permanent magnets;
two permanent magnets supported by said support structure, each of said two permanent magnets having a first face of a first magnetic polarity and a second face of a second magnetic polarity, said two permanent magnets supported in defined relative orientation and location so as to provide a magnetic field between a respective first face of a first of said two permanent magnets and a second face of the other of said two permanent magnets;
a magnetic material coupled between said second face of said first of said two permanent magnets and said first face of the other of said two permanent magnets; and
at least one magnetic shim situated between said first face of said first of said two permanent magnets and said second face of the other of said two permanent magnets, said magnetic shim having all of its dimensions smaller than a smallest dimension of either of said first face of said first of said two permanent magnets and said second face of the other of said two permanent magnets, wherein said at least one magnetic shim comprises a semiconductor wafer.

2. The magnetic apparatus of claim 1, wherein said two permanent magnets are NdFeB magnets.

3. The magnetic apparatus of claim 1, wherein said two permanent magnets have circular first and second faces.

4. The magnetic apparatus of claim 1, wherein said semiconductor is silicon.

5. The magnetic apparatus of claim 1, wherein at least one magnetic shim comprises a magnetic material having a higher susceptibility than said semiconductor.

6. The magnetic apparatus of claim 5, wherein said magnetic material having a higher susceptibility than said semiconductor is iron.

7. The magnetic apparatus of claim 5, wherein said magnetic material having a higher susceptibility than said semiconductor comprises nickel.

8. The magnetic apparatus of claim 5, wherein said magnetic material having a higher susceptibility than said semiconductor is present in a trench that is defined in said semiconductor.

9. A magnetic apparatus, comprising:
a support structure configured to support two permanent magnets in defined relative orientation and location, said support structure comprising non-magnetic material, said support structure having an aperture defined therein for placement of a measurement element and a material of interest between said two permanent magnets;
two permanent magnets supported by said support structure, each of said two permanent magnets having a first face of a first magnetic polarity and a second face of a second magnetic polarity, said two permanent magnets supported in defined relative orientation and location so as to provide a magnetic field between a respective firs face of a first of said two permanent magnets and a second face of the other of said two permanent magnets:
a magnetic material coupled between said second face of said first of said two permanent magnets and said first face of the other of said two permanent magnets; and
at least one magnetic shim situated between said first face of said first of said two permanent magnets and said second face of the other of said two permanent magnets, said magnetic shim having all of its dimensions smaller than a smallest dimension of either of said first face of said first of said two permanent magnets and said second face of the other of said two permanent magnets
wherein said magnetic shim comprises a coil configured to carry an imposed current, wherein said coil is present in a trench that is defined in a semiconductor.

10. The magnetic apparatus of claim 9, wherein said coil comprises copper.

11. The magnetic apparatus of claim 1, further comprising a protective layer.

* * * * *